United States Patent
Lee et al.

(10) Patent No.: US 12,414,290 B2
(45) Date of Patent: Sep. 9, 2025

(54) INTEGRATED CIRCUIT DEVICE

(71) Applicant: Samsung Electronics Co., Ltd., Suwon-si (KR)

(72) Inventors: Jieun Lee, Suwon-si (KR); Dongho Yu, Suwon-si (KR); Deoksung Hwang, Suwon-si (KR); Gisung Kim, Seoul (KR); Seungyoung Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 352 days.

(21) Appl. No.: 18/084,190

(22) Filed: Dec. 19, 2022

(65) Prior Publication Data
US 2023/0200054 A1    Jun. 22, 2023

(30) Foreign Application Priority Data
Dec. 20, 2021 (KR) ................... 10-2021-0183128

(51) Int. Cl.
*H10B 12/00* (2023.01)
*H01L 23/522* (2006.01)
*H01L 23/528* (2006.01)

(52) U.S. Cl.
CPC ....... *H10B 12/315* (2023.02); *H01L 23/5226* (2013.01); *H01L 23/5283* (2013.01); *H10B 12/482* (2023.02)

(58) Field of Classification Search
CPC . H10B 12/315; H10B 12/482; H01L 23/5226; H01L 23/5283
USPC ....................................................... 257/295
See application file for complete search history.

(56) References Cited

U.S. PATENT DOCUMENTS

| | | | |
|---|---|---|---|
| 7,659,567 B2 * | 2/2010 | Aoki | ................. H01L 21/76838 257/306 |
| 8,791,526 B2 | 7/2014 | Yoon et al. | |
| 9,559,103 B2 | 1/2017 | Park et al. | |
| 10,037,999 B2 | 7/2018 | Kim et al. | |
| 10,418,366 B2 | 9/2019 | Son et al. | |
| 2020/0152634 A1 | 5/2020 | Lee et al. | |
| 2020/0365537 A1 | 11/2020 | Choi et al. | |
| 2021/0066304 A1 | 3/2021 | Kang et al. | |
| 2021/0210493 A1 | 7/2021 | Kim et al. | |

FOREIGN PATENT DOCUMENTS

| | | |
|---|---|---|
| CN | 102122656 A | 7/2011 |
| KR | 1020200130945 A | 11/2020 |
| KR | 102198857 B1 | 1/2021 |

* cited by examiner

*Primary Examiner* — Tu-Tu V Ho
(74) *Attorney, Agent, or Firm* — Muir Patent Law, PLLC

(57) ABSTRACT

An integrated circuit device includes a substrate having an active region, a conductive landing pad at a first vertical level above the substrate and connected to the active region, a capacitor including a lower electrode at a second vertical level higher than the first vertical level above the substrate, and a conductive multifunction plug including an extended landing pad portion at a third vertical level between the first vertical level and the second vertical level and contacting the conductive landing pad, and an extended lower electrode portion integrally connected to the extended landing pad portion and contacting the lower electrode. The capacitor further includes a dielectric layer covering a surface of the lower electrode and the extended lower electrode portion of the conductive multifunction plug.

20 Claims, 25 Drawing Sheets

INTEGRATED CIRCUIT DEVICE

CROSS-REFERENCE TO RELATED APPLICATION

This application is based on and claims priority under 35 U.S.C. § 119 to Korean Patent Application No. 10-2021-0183128, filed on Dec. 20, 2021, in the Korean Intellectual Property Office, the disclosure of which is incorporated by reference herein in its entirety.

BACKGROUND

The inventive concept relates to an integrated circuit device, and particularly, to an integrated circuit device including a capacitor.

Along with the development of electronics technology, semiconductor devices have been rapidly down-scaled, and accordingly, patterns constituting electronic elements have been miniaturized. Accordingly, the development of an integrated circuit device having a structure capable of maintaining desired electrical characteristics by ensuring a required capacitance, even when a size of a capacitor is miniaturized, is desirable.

SUMMARY

The inventive concept provides an integrated circuit device having a structure capable of maintaining an increased capacitance and excellent electrical characteristics by ensuring an increased height of a lower electrode, even when a size of a capacitor is reduced, according to miniaturization of the integrated circuit device.

According to an aspect of the inventive concept, an integrated circuit device includes a substrate having an active region, a conductive landing pad at a first vertical level above the substrate and connected to the active region, a capacitor including a lower electrode at a second vertical level higher than the first vertical level above the substrate, and a conductive multifunction plug including an extended landing pad portion at a third vertical level between the first vertical level and the second vertical level and contacting the conductive landing pad, and an extended lower electrode portion integrally connected to the extended landing pad portion and contacting the lower electrode. The capacitor further includes a dielectric layer covering a surface of the lower electrode and the extended lower electrode portion of the conductive multifunction plug.

According to an aspect of the inventive concept, an integrated circuit device includes a plurality of bit line structures above a substrate to be parallel with each other, a plurality of contact structures arranged in spaces between two adjacent bit line structures of the plurality of bit line structures, each contact structure having a first pillar shape extending along a first straight line extending in a vertical direction, a plurality of conductive multifunction plugs on the plurality of contact structures, respectively, each conductive multifunction plug of the plurality of conductive multifunction plugs having a lower surface contacting a corresponding contact structure among the plurality of contact structures and a second pillar shape extending along a second straight line extending in the vertical direction, and the second straight line being spaced apart from the first straight line in a horizontal direction, and a plurality of capacitors including a plurality of lower electrodes disposed on the plurality of conductive multifunction plugs, respectively.

According to an aspect of the inventive concept, an integrated circuit device includes a substrate having an active region, a bit line above the substrate, an insulating structure covering an upper surface and a side-wall of the bit line, a contact structure including a contact plug adjacent to the bit line in a horizontal direction and connected to the active region, the insulating structure being disposed between the bit line and the contact plug, a metal silicide layer covering an upper surface of the contact plug, and a conductive landing pad covering an upper surface of the metal silicide layer, a guide insulation pattern having a lower surface contacting the insulating structure and the conductive landing pad, and an upper surface at a vertical level farther from the substrate than an upper surface of the conductive landing pad, a conductive multifunction plug including an extended landing pad portion contacting the insulating structure, the conductive landing pad, and the guide insulation pattern, and an extended lower electrode portion integrally connected to the extended landing pad portion and protruding beyond the upper surface of the guide insulation pattern in a first vertical direction away from the substrate, and a capacitor including a lower electrode contacting an upper surface of the conductive multifunction plug and extending along a straight line extending in the first vertical direction, a dielectric layer covering a surface of the lower electrode and a portion of a sidewall of the extended lower electrode portion, and an upper electrode facing the lower electrode and the extended lower electrode portion. The dielectric layer is disposed between the upper electrode and the lower electrode and between the upper electrode and the extended lower electrode portion.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
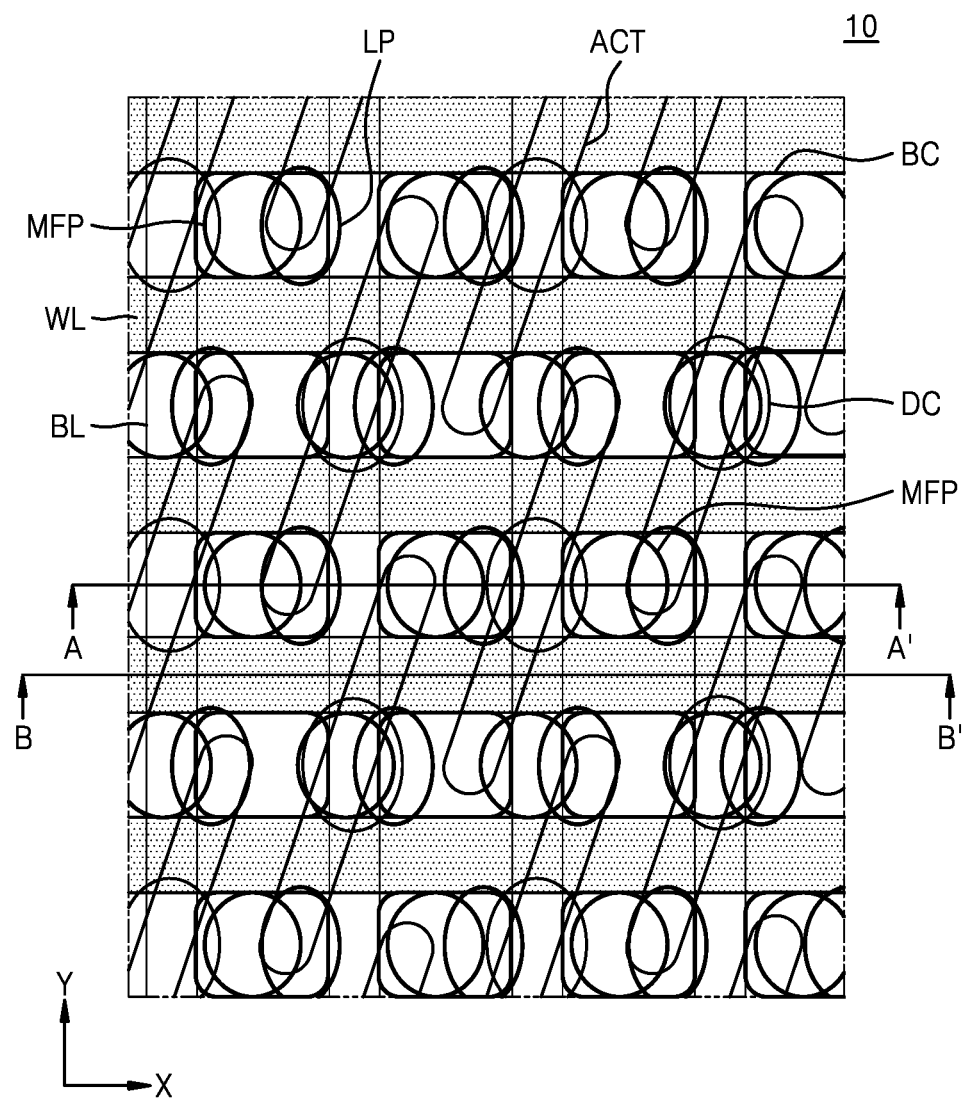
FIG. 1 is a schematic plan layout for describing a memory cell array area of an integrated circuit device according to embodiments of the inventive concept.

Hereinafter, embodiments of the inventive concept are described in detail with reference to the accompanying drawings. Like reference numerals in the drawings denote like elements, and a repeated description thereof is omitted.

FIG. 1 is a schematic plan layout for describing a memory cell array area of an integrated circuit device 10 according to embodiments of the inventive concept.

Referring to FIG. 1, the integrated circuit device 10 may include a plurality of active regions ACT. The plurality of active regions ACT may be arranged in a diagonal direction with respect to a first horizontal direction (X direction) and a second horizontal direction (Y direction).

A plurality of word lines WL may extend in parallel to each other in the first horizontal direction (X direction) by crossing the plurality of active regions ACT. Above the plurality of word lines WL, a plurality of bit lines BL may extend in parallel to each other in the second horizontal direction (Y direction) intersecting with the first horizontal direction (X direction). The plurality of bit lines BL may be connected to the plurality of active regions ACT via a direct contact DC.

A plurality of buried contacts BC may be formed between every two adjacent bit lines BL among the plurality of bit lines BL. In example embodiments, the plurality of buried contacts BC may be arranged in a line in the first horizontal direction (X direction) and the second horizontal direction (Y direction). A plurality of conductive landing pads LP may be respectively on the plurality of buried contacts BC. A plurality of conductive multifunction plugs MFP may be respectively on the plurality of conductive landing pads LP.

The plurality of buried contacts BC, the plurality of conductive landing pads LP, and the plurality of conductive multifunction plugs MFP may function to connect the lower electrodes of a plurality of capacitors (not shown) formed on the plurality of conductive multifunction plugs MFP to an active region ACT. At least a portion of each of the plurality of conductive landing pads LP may vertically overlap a buried contact BC. At least a portion of each of the plurality of conductive multifunction plugs MFP may vertically overlap a corresponding conductive landing pad of the conductive landing pads LP.

A lower part of each of the plurality of conductive multifunction plugs MFP may constitute an extended landing pad portion ELP (e.g., see FIG. 2) configured to perform a landing pad function with a corresponding conductive landing pad of the conductive landing pads LP. In an embodiment, a combined structure of the extended landing pad portion ELP and the conductive landing pad LP may serve as a landing pad that secures, if there is a misalignment between the direct contact DC and a corresponding lower electrode among a plurality of lower electrodes LE (e.g., see FIG. 2), connection therebetween. In an embodiment, the extended landing pad portion ELP and the conductive landing pad LP may be separately formed, and the combined structure of the extended landing pad portion ELP and the conductive landing pad LP may serve as the landing pad for increasing a process margin. An upper part of each of the plurality of conductive multifunction plugs MFP may constitute an extended lower electrode portion ELE (e.g., see FIG. 2) configured to perform a lower electrode function of a capacitor with and a lower electrode LE (e.g., see, FIG. 2). The extended landing pad portion ELE and the extended lower electrode portion may have a structure integrally connected to each other.

Figure 2:
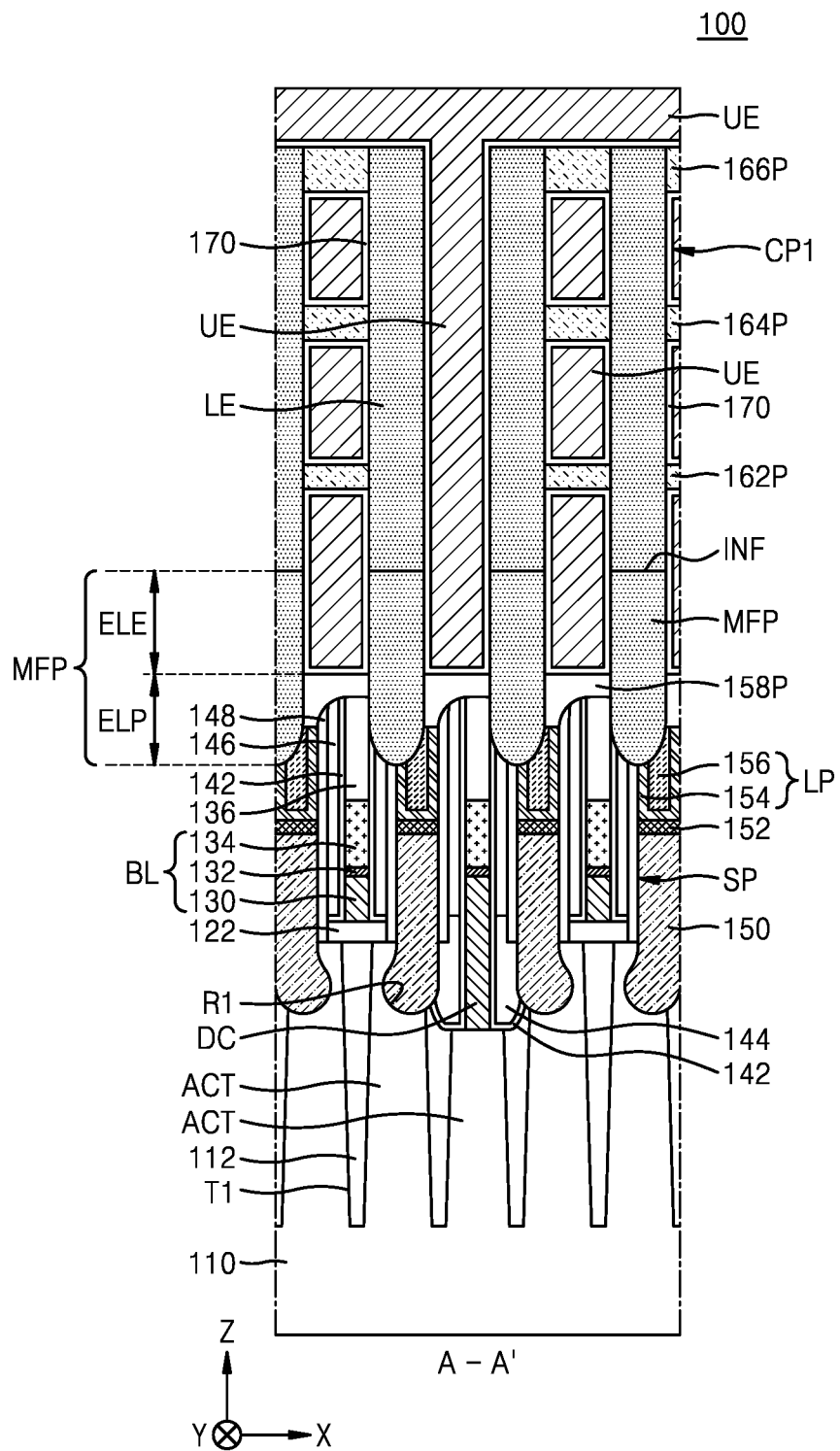
FIG. 2 is a cross-sectional view for describing an integrated circuit device according to embodiments of the inventive concept.

FIG. 2 is a cross-sectional view for describing an integrated circuit device 100 according to embodiments of the inventive concept. FIG. 2 shows some components of a part corresponding to a cross-section taken along line A-A' of FIG. 1. The integrated circuit device 100 shown in FIG. 2 may have the same layout as the integrated circuit device 10 shown in FIG. 1. In FIG. 2, like reference numerals in FIG. 1 denote like members.

Referring to FIG. 2, the integrated circuit device 100 may include a substrate 110 in which each of the plurality of active regions ACT is defined by a device isolation layer 112. The device isolation layer 112 may be formed inside a device isolation trench T1 formed in the substrate 110.

The substrate 110 may include or may be formed of silicon (Si), e.g., monocrystalline Si, polycrystalline Si, or amorphous Si. For example, the substrate 110 may include a semiconductor element such as Si and germanium (Ge), or a compound semiconductor such as SiGe, silicon carbide (SiC), gallium arsenide (GaAs), indium arsenide (InAs), and indium phosphide (InP). In example embodiments, the substrate 110 may include conductive regions, e.g., an impurity-doped well or an impurity-doped structure. The device isolation layer 112 may include or may be an oxide layer, a nitride layer, or a combination thereof. The plurality of word lines WL shown in FIG. 1 may be buried in the substrate 110.

A buffer layer 122 may be formed on the substrate 110. The buffer layer 122 may cover upper surfaces of the plurality of active regions ACT and an upper surface of the device isolation layer 112. The buffer layer 122 may include or may be formed of a first silicon oxide layer, a silicon nitride (SiN) layer, and a second silicon oxide layer sequentially formed on the substrate 110 but is not limited thereto.

The plurality of bit lines BL extending in the second horizontal direction (Y direction) to be parallel to each other may be on the buffer layer 122. The plurality of bit lines BL may be separated from each other in the first horizontal direction (X direction). The direct contact DC may be on a partial region of each of the plurality of active regions ACT. Each of the plurality of bit lines BL may be connected to the active region ACT via the direct contact DC. The direct contact DC may include or may be formed of Si, Ge, tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), or a combination thereof. In example embodiments, the direct contact DC may include or may be formed of doped polysilicon.

Each of the plurality of bit lines BL may include a lower conductive layer 130, an intermediate conductive layer 132, and an upper conductive layer 134 sequentially formed above the substrate 110. An upper surface of each of the plurality of bit lines BL may be covered by an insulating capping pattern 136. The insulating capping pattern 136 may be on the upper conductive layer 134. An upper surface of the lower conductive layer 130 of each bit line BL may be coplanar with an upper surface of the direct contact DC. Although FIG. 2 shows that each of the plurality of bit lines BL has a triple conductive layer structure including the lower conductive layer 130, the intermediate conductive layer 132, and the upper conductive layer 134, the inventive concept is not limited thereto. For example, each of the plurality of bit lines BL may be formed by a single conductive layer, dual conductive layers, or a stack structure of a plurality of conductive layers greater than or equal to quadruple conductive layers.

In example embodiments, the lower conductive layer 130 may include or may be a doped polysilicon layer. Each of the intermediate conductive layer 132 and the upper conductive layer 134 may include or may be a layer including Ti, TiN, titanium silicon nitride (TiSiN), W, WN, tungsten silicide ($WSi_x$), tungsten silicon nitride ($WSi_xN_y$), Ru, or a combination thereof. For example, the intermediate conductive layer 132 may include or may be a TiN layer and/or a TiSiN layer, and the upper conductive layer 134 may include or may be a layer including Ti, TiN, W, WN, $WSi_xN_y$, Ru, or a combination thereof. The insulating capping pattern 136 may include or may be a SiN layer.

In a partial region of the substrate 110, a plurality of recess spaces R1 may be formed in the active region ACT. The plurality of recess spaces R1 may be filled with a plurality of contact plugs 150. Each of the plurality of contact plugs 150 may have a pillar shape extending in a vertical direction (Z direction) from the recess space R1. Each of the plurality of contact plugs 150 may contact the active region ACT. A lower end portion of each of the plurality of contact plugs 150 may be at a lower level than an upper surface of the substrate 110 to be buried in the substrate 110. The plurality of contact plugs 150 may include an impurity-doped semiconductor pattern but is not limited thereto.

In the integrated circuit device 100, one direct contact DC and a pair contact plugs 150 facing each other with the one direct contact DC therebetween may be connected to different active regions ACT among the plurality of active regions ACT in the cross-sectional view of FIG. 2. In each of the active region of the plurality of active regions as shown in FIG. 1, a single direct contact DC and two buried contacts BC may be arranged along the diagonal direction, and the direct contact DC may be disposed between the two buried contacts BC.

A plurality of contact plugs 150 may be arranged in a line in the second horizontal direction (Y direction) between a pair of bit lines BL selected from among the plurality of bit lines BL and adjacent to each other. An insulating fence (see 149 of FIG. 4I) may be between every two of the plurality of contact plugs 150 arranged in a line in the second horizontal direction (Y direction). The plurality of contact plugs 150 may be insulated from each other by a plurality of insulating fences (see 149 of FIG. 4I). Each of the plurality of insulating fences (see 149 of FIG. 4I) may have a pillar shape extending in the vertical direction (Z direction) on the substrate 110. In example embodiments, the plurality of insulating fences 149 may include or may be a SiN layer.

A plurality of metal silicide layers 152 and a plurality of conductive landing pads LP may be on the plurality of contact plugs 150. Each of the plurality of conductive landing pads LP may extend long in the vertical direction (Z direction) above the contact plug 150. Each of the plurality of conductive landing pads LP may be connected to the contact plug 150 via the metal silicide layer 152. Each of the plurality of conductive landing pads LP may include a conductive barrier layer 154 and a metal layer 156. In example embodiments, the conductive barrier layer 154 may include or may be formed of Ti, TiN, or a combination thereof, and the metal layer 156 may include or may be formed of W. The plurality of conductive landing pads LP may have a pattern shape having a plurality of islands in a top view. In example embodiments, the metal silicide layer 152 may include or may be formed of cobalt silicide, nickel silicide, or manganese silicide but is not limited thereto.

The contact plug 150 and the metal silicide layer 152 may constitute the buried contact BC shown in FIG. 1. The contact plug 150, the metal silicide layer 152, and the conductive landing pad LP sequentially disposed on the substrate 110 may constitute a contact structure connected to the active region ACT of the substrate 110 at a position adjacent to the bit line BL in the first horizontal direction (X direction).

A spacer structure SP may cover opposite sidewalls of each of the plurality of bit lines BL and opposite sidewalls of each of a plurality of insulating capping patterns 136. The plurality of insulating capping patterns 136 may cover upper surfaces of the plurality of bit lines BL, respectively. One spacer structure SP may be between one bit line BL selected from among the plurality of bit lines BL and the plurality of contact plugs 150 arranged in a line in the second horizontal direction (Y direction) at a position adjacent to the selected one bit line BL. Each of a plurality of spacer structures SP may include an inner insulating spacer 142, an intermediate insulating spacer 146, and an outer insulating spacer 148.

The inner insulating spacer 142 may be in contact with each of a side-wall of the bit line BL and a side-wall of the direct contact DC. The inner insulating spacer 142 may include a part in contact with the contact plug 150. The inner insulating spacer 142 may include or may be formed of a SiN layer. The intermediate insulating spacer 146 may be between the inner insulating spacer 142 and the outer insulating spacer 148 in the first horizontal direction (X direction). The intermediate insulating spacer 146 may have a first sidewall facing the bit line BL. The inner insulating spacer 142 may be disposed between the intermediate insulating spacer 146 and the bit line BL. The intermediate insulating spacer 146 may further have a second sidewall, opposite to the first sidewall, facing a combined structure of the contact plug 150, the metal silicide layer 152, and the conductive landing pad LP. The outer insulating spacer 148 may be disposed between the combined structure and the intermediate insulating spacer 146. The intermediate insulating spacer 146 may include or may be a silicon oxide layer, an air spacer, or a combination thereof. In the specification, the term "air" may indicate gases which may exist in the atmosphere or in a manufacturing process. The outer insulating spacer 148 may be in contact with a side-wall of each of the contact plug 150, the metal silicide layer 152, and the conductive landing pad LP. The outer insulating spacer 148 may be separated from the inner insulating spacer 142 with the intermediate insulating spacer 146 therebetween. In example embodiments, the outer insulating spacer 148 may include or may be a SiN layer.

The spacer structure SP may extend in parallel to the bit line BL in the second horizontal direction (Y direction). The insulating capping pattern 136 and the spacer structure SP may constitute an insulating structure covering an upper surface and both side walls of the bit line BL. In the specification, a combined structure of the insulating capping pattern 136 and the spacer structure SP may be referred to as an insulating structure. In the specification, a structure including the bit line BL, the insulating capping pattern 136, and the spacer structure SP adjacent to each other may be referred to as a bit line structure.

A gap-fill insulating pattern 144 may be between the direct contact DC and the contact plug 150. The gap-fill insulating pattern 144 may be separated from the direct contact DC with the inner insulating spacer 142 therebetween. The gap-fill insulating pattern 144 may surround the direct contact DC while covering side-walls of the direct contact DC. The gap-fill insulating pattern 144 may be in contact with the inner insulating spacer 142 and the contact plug 150. In example embodiments, the gap-fill insulating pattern 144 may include or may be a SiN layer.

A guide insulation pattern 158P may cover the plurality of conductive landing pads LP, and an insulating structure including the plurality of insulating capping patterns 136 and the plurality of spacer structures SP. The guide insulation pattern 158P may have a first surface (e.g., a curved lower surface) in contact with the insulating structure, a second surface (e.g., a flat lower surface) in contact with the conductive landing pad LP, and an upper surface at a vertical level farther from the substrate 110 than an upper surface of the conductive landing pad LP. In an embodiment, the guide insulation pattern 158P may have a lower surface contacting the insulating structure and the conductive landing pad LP. In an embodiment, the guide insulation pattern 158P may surround a portion of the extended landing pad portion ELP, and a side surface of the guide insulation pattern 158P may contact the portion of the extended landing pad portion ELP. In an embodiment, the upper surface of the guide insulation pattern 158P may be coplanar with an upper surface of the landing pad portion ELP or may be positioned at the same height as the upper surface of the landing pad portion ELP. The term "vertical level" used in the specification indicates a height in the vertical direction (Z or −Z direction).

The plurality of conductive multifunction plugs MFP may be respectively on the plurality of conductive landing pads LP. Each of the plurality of conductive multifunction plugs MFP may be between every two of a plurality of bit line structures in the first horizontal direction (X direction). Each bit line structure may include the bit line BL, the insulating capping pattern 136, and the spacer structure SP. Each of the plurality of conductive multifunction plugs MFP may have a pillar shape extending long in a direction away from the substrate 110 in the vertical direction (Z direction) at a position shifted in a horizontal direction (e.g., the X direction) from one contact structure selected from among a plurality of contact structures including the conductive landing pad LP. Each of the plurality of conductive multifunction plugs MFP may be in contact with a partial region of the conductive landing pad LP. In the conductive landing pad LP and the conductive multifunction plug MFP contacting each other, the conductive landing pad LP may have a pillar shape having a first vertical axis following the vertical direction (Z direction), and the conductive multifunction plug MFP may have a pillar shape having a second vertical axis following the vertical direction (Z direction). The second vertical axis may be shifted from the first vertical axis in a horizontal direction (e.g., the X direction). In an embodiment, the conductive landing pad LP may have a pillar shape extending along a first vertical straight line extending in the vertical direction (Z direction), and the conductive multifunction plug MFP may have a pillar shape extending along a second vertical straight line extending in the vertical direction (Z direction). The second vertical straight line may be spaced apart from the first vertical straight line in a horizontal direction (e.g., the X direction).

A part of each of the plurality of conductive multifunction plugs MFP may be at a vertical level higher than a vertical level at which the plurality of conductive landing pads LP are arranged. A vertical level of the lowermost surface of each of the plurality of conductive multifunction plugs MFP may be lower than a vertical level of the uppermost surface of the conductive landing pad LP, and a vertical level of the uppermost surface of each of the plurality of conductive multifunction plugs MFP may be higher than the vertical level of the uppermost surface of the conductive landing pad LP. The vertical level of the lowermost surface of each of the plurality of conductive multifunction plugs MFP may be closer to the substrate 110 than the vertical level of the uppermost surface of the conductive landing pad LP. In an embodiment, an upper surface of each of the plurality of conductive multifunction plugs MFP may be higher than the uppermost surface of the conductive landing pad LP.

Each of the plurality of conductive multifunction plugs MFP may pass through the guide insulation pattern 158P in the vertical direction (Z direction). Each of the plurality of conductive multifunction plugs MFP may have a surface in contact with the conductive landing pad LP. Each of the plurality of conductive multifunction plugs MFP may be in contact with at least one selected from among the insulating capping pattern 136, the inner insulating spacer 142, the intermediate insulating spacer 146, and the outer insulating spacer 148. The inner insulating spacer 142, the intermediate insulating spacer 146, and the outer insulating spacer 148 may constitute the spacer structure SP.

The guide insulation pattern 158P may have an insulating surface in contact with a lower-side surface of the conductive multifunction plug MFP. A vertical level of the uppermost surface of the guide insulation pattern 158P may be closer to the substrate 110 than the vertical level of the uppermost surface of the conductive multifunction plug MFP and farther from the substrate 110 than the vertical level of the uppermost surface of the conductive landing pad LP.

Each of the plurality of conductive multifunction plugs MFP may include a part between one bit line structure selected from among the plurality of bit line structures, which includes the bit line BL, the insulating capping pattern 136, and the spacer structure SP, and one contact structure selected from among the plurality of contact structures, which includes the contact plug 150, the metal silicide layer 152, and the conductive landing pad LP.

Each of the plurality of conductive multifunction plugs MFP may include an extended landing pad portion ELP in contact with the conductive landing pad LP, and an extended lower electrode portion ELE integrally connected to the extended landing pad portion ELP and extending upward in the vertical direction (Z direction) from the extended landing pad portion ELP.

A plurality of capacitors CP1 may be above the plurality of conductive landing pads LP. Each of the plurality of capacitors CP1 may include the extended lower electrode portion ELE that is an upper part of each of the plurality of conductive multifunction plugs MFP, a lower electrode LE, a dielectric layer 170, and an upper electrode UE. The dielectric layer 170 may cover a plurality of extended lower electrode portions ELE and a plurality of lower electrodes LE. The upper electrode UE may cover the dielectric layer 170 and face the plurality of extended lower electrode portions ELE and the plurality of lower electrodes LE with the dielectric layer 170 therebetween.

The plurality of lower electrodes LE may be at a vertical level higher than a vertical level at which the plurality of conductive multifunction plugs MFP are arranged. Each of the plurality of lower electrodes LE may have a pillar shape extending long upward in the vertical direction (Z direction) from an upper surface of the extended lower electrode portion ELE included in the conductive multifunction plug MFP. However, the inventive concept is not limited thereto. For example, each of the plurality of lower electrodes LE may have a cross-sectional structure of a cup shape or a cylindrical shape with a closed bottom portion.

The plurality of lower electrodes LE may include or may be formed of a first metal. The upper electrode UE may include or may be formed of a second metal. In example embodiments, the second metal may be the same as the first metal. In example embodiments, the second metal may be different from the first metal.

Each of the lower electrode LE and the upper electrode UE may include or may be formed of a metal layer, a conductive metal oxide layer, a conductive metal nitride layer, a conductive metal oxynitride layer, or a combination thereof. In example embodiments, each of the lower electrode LE and the upper electrode UE may include or may be formed of niobium (Nb), Nb oxide, Nb nitride, Nb oxynitride, Ti, Ti oxide, Ti nitride, Ti oxynitride, Co, Co oxide, Co nitride, Co oxynitride, tin (Sn), Sn oxide, Sn nitride, Sn oxynitride, or a combination thereof. For example, each of the lower electrode LE and the upper electrode UE may include or may be formed of NbN, TiN, CoN, $SnO_2$, or a combination thereof. In example embodiments, each of the lower electrode LE and the upper electrode UE may include or may be formed of tantalum nitride (TaN), titanium aluminum nitride (TiAlN). tantalum aluminum nitride (TaAlN). vanadium (V), vanadium nitride (VN), Mo, molybdenum nitride (MoN), W, WN, Ru, ruthenium oxide ($RuO_2$), strontium ruthenium oxide (SRO ($SrRuO_3$)), iridium (Ir), iridium oxide ($IrO_2$), platinum (Pt), platinum oxide (PtO), barium strontium ruthenium oxide (BSRO (($Ba,Sr)RuO_3$)), calcium ruthenium oxide (CRO ($CaRuO_3$)), lanthanum strontium cobalt oxide (LSCO (($La,Sr)CoO_3$)), or a combination thereof. However, a constituent material of each of the lower electrode LE and the upper electrode UE is not limited thereto.

The dielectric layer 170 may include or may be a high dielectric layer. The term "high dielectric layer" used in the specification indicates a dielectric layer having a higher dielectric constant than a silicon oxide layer. In example embodiments, the dielectric layer 170 may include metal oxide including at least one metal selected from among hafnium (Hf), Zr, Al, Nb, cerium (Ce), La, Ta, and Ti. In example embodiments, the dielectric layer 170 may have a single layer structure including one high dielectric layer. In example embodiments, the dielectric layer 170 may have a multi-layer structure including a plurality of high dielectric layers. The high dielectric layer may include hafnium oxide ($HfO_2$), zirconium oxide ($ZrO_2$), aluminum oxide ($Al_2O_3$), lanthanum oxide ($La_2O_3$), tantalum oxide ($Ta_2O_3$), niobium oxide ($Nb_2O_5$), cerium oxide ($CeO_2$), titanium oxide ($TiO_2$), germanium oxide ($GeO_2$), or a combination thereof but is not limited thereto. In example embodiments, a thickness of the dielectric layer 170 may be between about 20 Å and about 80 Å but is not limited thereto. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

A vertical level of the lowermost surface of each of the plurality of lower electrodes LE may be higher than the vertical level of the uppermost surface of the conductive landing pad LP. In an embodiment, a lower surface of each of the plurality of lower electrodes LE may be higher than the uppermost surface of the conductive landing pad LP. Each of the plurality of lower electrodes LE may have the lower surface in contact with the extended lower electrode portion ELE of one conductive multifunction plug MFP selected from among the plurality of conductive multifunction plugs MFP. The lowermost surface of each of the plurality of lower electrodes LE may be in contact with the uppermost surface of the extended lower electrode portion ELE. In an embodiment, the lower surface of each of the plurality of lower electrodes LE may contact an upper surface of the extended lower electrode portion ELE. A vertical level of an interface INF between the conductive multifunction plug MFP and the lower electrode LE may be higher than a vertical level of the lowermost surface of the upper electrode UE.

The dielectric layer 170 may include parts respectively covering the surfaces of the plurality of lower electrodes LE and parts each covering a surface of the extended lower electrode portion ELE that is an upper-side surface of each of the plurality of conductive multifunction plugs MFP.

In example embodiments, each of the plurality of conductive multifunction plugs MFP may include or may be formed of Nb, Nb oxide, Nb nitride, Nb oxynitride, Ti, Ti oxide, Ti nitride, Ti oxynitride, Co, Co oxide, Co nitride, Co oxynitride, tin (Sn), Sn oxide, Sn nitride, Sn oxynitride, or a combination thereof. For example, each of the plurality of conductive multifunction plugs MFP may include or may be formed of NbN, TiN, CoN, $SnO_2$, or a combination thereof. In other example embodiments, each of the plurality of conductive multifunction plugs MFP may include TaN, TiAlN. TaAlN. V, VN, Mo, MoN, W, WN, Ru, $RuO_2$, SRO ($SrRuO_3$), Ir, $IrO_2$, Pt, PtO, BSRO ($Ba,Sr)RuO_3$), CRO ($CaRuO_3$), LSCO (($La,Sr)CoO_3$), or a combination thereof.

In example embodiments, the plurality of conductive multifunction plugs MFP and the plurality of lower electrodes LE may include or may be formed of the same metal. In example embodiments, the plurality of conductive multifunction plugs MFP and the plurality of lower electrodes LE may include the same material. In example embodiments, the plurality of conductive landing pads LP and the plurality of conductive multifunction plugs MFP may include different metals. In example embodiments, the plurality of conductive landing pads LP and the plurality of conductive multifunction plugs MFP may include different materials. For example, each of the plurality of conductive landing pads LP may include the conductive barrier layer 154 including or being formed of Ti, TiN, or a combination thereof and the metal layer 156 including or being formed of W, and each of the plurality of conductive multifunction plugs MFP and the plurality of lower electrodes LE may include a TiN layer, but the inventive concept is not limited thereto.

The extended landing pad portion ELP may include a lower part of the conductive multifunction plug MFP relatively close to the substrate 110 and be adjacent to the conductive landing pad LP. The extended landing pad portion ELP may include a surface in contact with the conductive landing pad LP, a surface in contact with an insulating structure including the insulating capping pattern 136 and the spacer structure SP, and a surface in contact with the guide insulation pattern 158P. The extended landing pad portion ELP may be in contact with at least one selected from among the insulating capping pattern 136, the inner insulating spacer 142, the intermediate insulating spacer 146, and the outer insulating spacer 148 that constitute the insulating structure.

The extended lower electrode portion ELE may include an upper part of the conductive multifunction plug MFP relatively far from the substrate 110 and be adjacent to the lower electrode LE. The extended lower electrode portion ELE may have a sidewall covered by the dielectric layer 170. The extended lower electrode portion ELE may protrude in a direction away from the substrate 110 in the vertical direction (Z direction) from a vertical level of an upper surface of the guide insulation pattern 158P.

Each of the plurality of lower electrodes LE may protrude in a direction away from the substrate 110 in the vertical direction (Z direction) from the upper surface of the extended lower electrode portion ELE of the conductive multifunction plug MFP.

The dielectric layer 170 may include parts covering the surfaces of the plurality of lower electrodes LE, parts each covering the extended lower electrode portion ELE of each of the plurality of conductive multifunction plugs MFP, and parts each covering the upper surface of the guide insulation pattern 158P. In example embodiments, the dielectric layer 170 may include parts in contact with the plurality of lower electrodes LE, parts each in contact with the extended lower electrode portion ELE of each of the plurality of conductive multifunction plugs MFP, and parts each in contact with the upper surface of the guide insulation pattern 158P.

In example embodiments, a vertical-direction (Z-direction) length of the extended lower electrode portion ELE in each of the plurality of conductive multifunction plugs MFP may be greater than a vertical-direction (Z-direction) length of the extended landing pad portion ELP. The extended lower electrode portion ELE may perform the same function as the lower electrode LE. Therefore, the extended lower electrode portion ELE may increase a height of a substantial lower electrode portion constituting the capacitor CP1. Accordingly, even when a size of the capacitor CP1 is reduced according to miniaturization of the integrated circuit device 100, an increased capacitance and excellent electrical characteristics may be maintained by ensuring an increased height at the substantial lower electrode portion of the capacitor CP1 including the extended lower electrode portion ELE and the lower electrode LE.

The integrated circuit device 100 may include a plurality of support patterns supporting the plurality of lower electrodes LE. The plurality of support patterns may include a first support pattern 162P, a second support pattern 164P, and a third support pattern 166P extending in a horizontal direction at a vertical level higher than the vertical level of the uppermost surface of each of the plurality of conductive multifunction plugs MFP and sequentially disposed in the vertical direction (Z direction). Each of the plurality of lower electrodes LE may pass through the first support pattern 162P, the second support pattern 164P, and the third support pattern 166P in the vertical direction (Z direction) and have surfaces respectively in contact with the first support pattern 162P, the second support pattern 164P, and the third support pattern 166P. The dielectric layer 170 may include parts respectively covering the first support pattern 162P, the second support pattern 164P, and the third support pattern 166P.

The vertical level of the interface INF between the conductive multifunction plug MFP and the lower electrode LE may be closer to the substrate 110 than a vertical level of the lowermost surface of the first support pattern 162P. In an embodiment, the plurality of conductive multifunction plugs MFP and the plurality of lower electrodes LE may be formed of the same material, but due to separate formation of the plurality of conductive multifunction plugs MFP and the plurality of lower electrodes LE, the interface INF may exist between each of the plurality of conductive multifunction plugs MFP and a corresponding one of the plurality of lower electrodes LE. Since the plurality of conductive multifunction plugs MFP and the plurality of lower electrodes LE may be formed of the same material, connections thereof having the interface INF may be referred to "integrally connected."

Each of the first support pattern 162P, the second support pattern 164P, and the third support pattern 166P may include or may be a SiN layer, a silicon carbon nitride (SiCN) layer, a silicon boron nitride (SiBN) layer, or a combination thereof. In example embodiments, the first support pattern 162P, the second support pattern 164P, and the third support pattern 166P may include or may be formed of the same material. In example embodiments, at least two of the first support pattern 162P, the second support pattern 164P, and the third support pattern 166P may include or may be formed of different materials.

Figure 3:
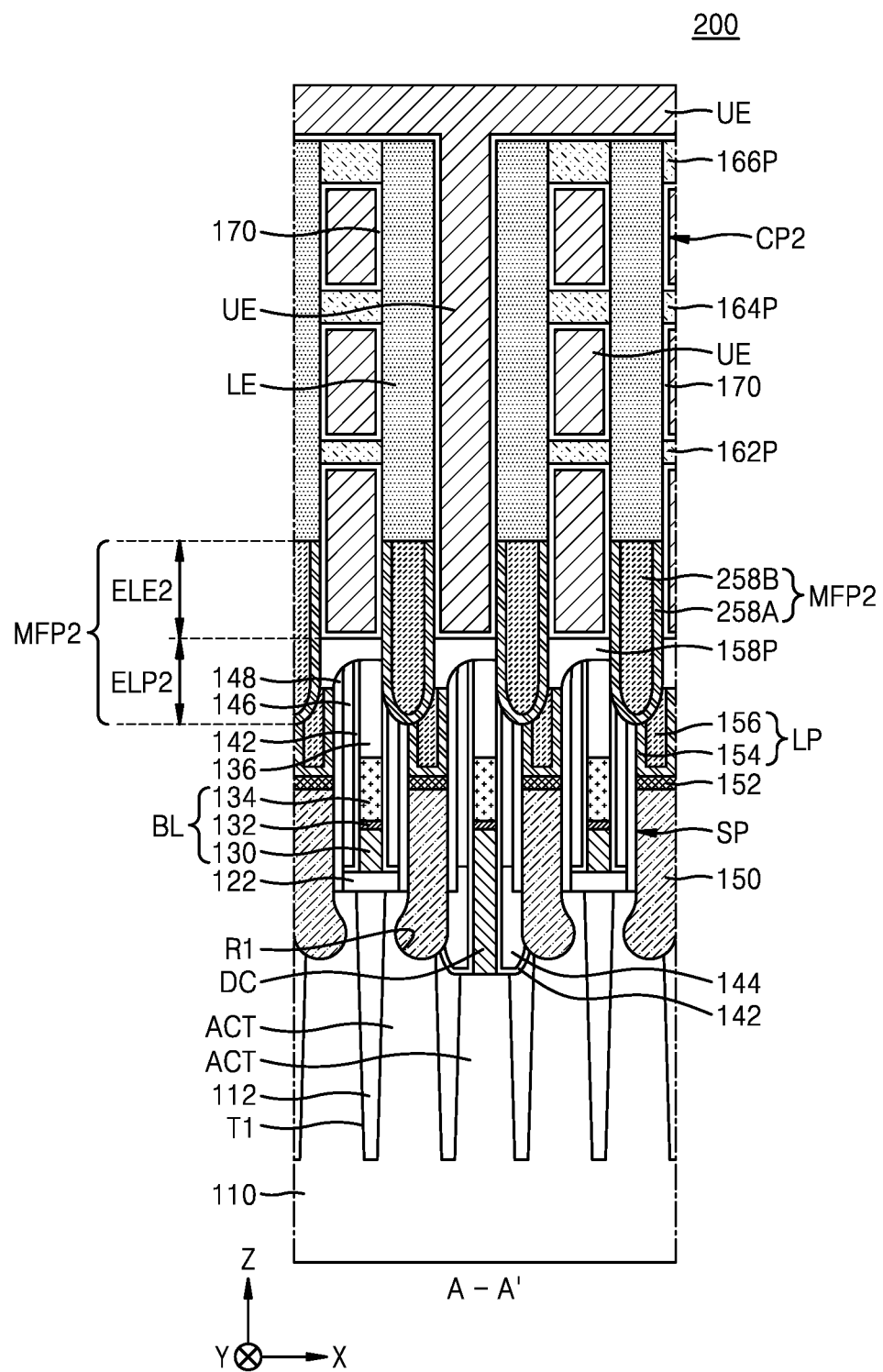
FIG. 3 is a cross-sectional view for describing an integrated circuit device according to embodiments of the inventive concept.

FIG. 3 is a cross-sectional view for describing an integrated circuit device 200 according to embodiments of the inventive concept. FIG. 3 shows some components of a part corresponding to a cross-section taken along line A-A' of FIG. 1. The integrated circuit device 200 shown in FIG. 3 may have the same layout as the integrated circuit device 10 shown in FIG. 1. In FIG. 3, like reference numerals in FIGS. 1 and 2 denote like members, and a repeated description thereof is omitted herein.

Referring to FIG. 3, the integrated circuit device 200 may have the same configuration as the integrated circuit device 100 described with reference to FIG. 2. However, the integrated circuit device 200 may include a plurality of conductive multifunction plugs MPF2 instead of the plurality of conductive multifunction plugs MFP. The plurality of lower electrodes LE may be on the plurality of conductive multifunction plugs MPF2.

The plurality of conductive multifunction plugs MPF2 may have the same configuration as the plurality of conductive multifunction plugs MFP described with reference to FIG. 2, except that the plurality of conductive multifunction plugs MPF2 and the plurality of lower electrodes LE may include different metals. In example embodiments, the plurality of conductive multifunction plugs MFP2 and the plurality of lower electrodes LE may include different materials. In example embodiments, the plurality of conductive landing pads LP and the plurality of conductive multifunction plugs MFP2 may include the same metal. In example embodiments, the plurality of conductive landing pads LP and the plurality of conductive multifunction plugs MFP2 may include the same material. For example, each of the plurality of conductive landing pads LP may include the conductive barrier layer 154 including or being formed of Ti, TiN, or a combination thereof, and the metal layer 156 including or being formed of W, each of the plurality of conductive multifunction plugs MPF2 may include a conductive barrier layer 258A including or being formed of Ti, TiN, or a combination thereof, and a metal layer 258B including or being formed of W, and the plurality of lower electrodes LE may include or may be formed of a TiN layer, but the inventive concept is not limited thereto.

Each of the plurality of conductive multifunction plugs MPF2 may include an extended landing pad portion ELP2 and an extended lower electrode portion ELE2 integrally connected with each other. A detailed configuration of the extended landing pad portion ELP2 and the extended lower electrode portion ELE2 included in each of the plurality of conductive multifunction plugs MPF2 is the same as a detailed configuration of the extended landing pad portion ELP and the extended lower electrode portion ELE included in each of the plurality of conductive multifunction plugs MFP described with reference to FIG. 2, except that the plurality of conductive multifunction plugs MPF2 and the plurality of lower electrodes LE may include or may be formed of different conductive materials.

A plurality of capacitors CP2 may be above the plurality of conductive landing pads LP. The plurality of capacitors CP2 may include a plurality of extended lower electrode portions ELE2, the plurality of lower electrodes LE, the dielectric layer 170, and the upper electrode UE. The dielectric layer 170 may include parts covering the surfaces of the plurality of lower electrodes LE, parts covering the plurality of extended lower electrode portions ELE2, parts each covering the upper surface of the guide insulation pattern 158P, and parts covering respective surfaces of the first support pattern 162P, the second support pattern 164P, and the third support pattern 166P. The upper electrode UE may face the lower electrode LE and the extended lower electrode portion ELE2 of the conductive multifunction plug MPF2 with the dielectric layer 170 therebetween.

In example embodiments, a vertical-direction (Z-direction) length of the extended lower electrode portion ELE2 in each of the plurality of conductive multifunction plugs MFP2 may be greater than a vertical-direction (Z-direction) length of the extended landing pad portion ELP2. The extended lower electrode portion ELE2 may perform the same function as the lower electrode LE. Therefore, the extended lower electrode portion ELE2 may increase a height of a substantial lower electrode portion constituting the capacitor CP2. Accordingly, even when a size of the capacitor CP2 is reduced according to miniaturization of the integrated circuit device 200, an increased capacitance and excellent electrical characteristics may be maintained by ensuring an increased height at the substantial lower electrode portion of the capacitor CP2 including the extended lower electrode portion ELE2 and the lower electrode LE.

Hereinafter, a method of manufacturing integrated circuit devices, according to embodiments of the inventive concept, is described.

Figure 4A:
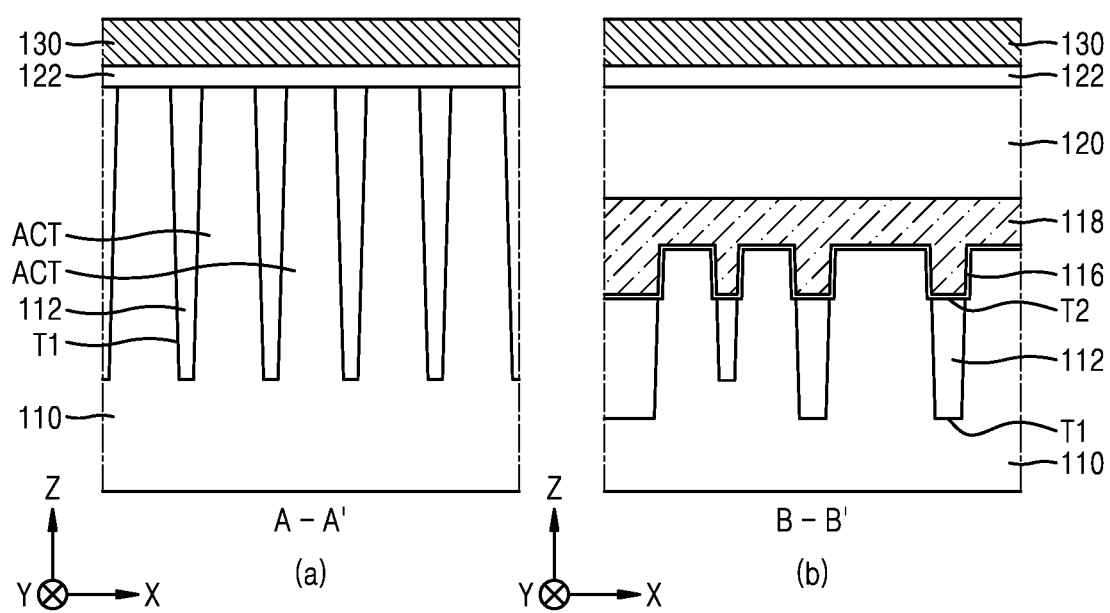
FIGS. 4A to 4V are cross-sectional views for describing a method of manufacturing an integrated circuit device, according to embodiments of the inventive concept.
Figure 4B:
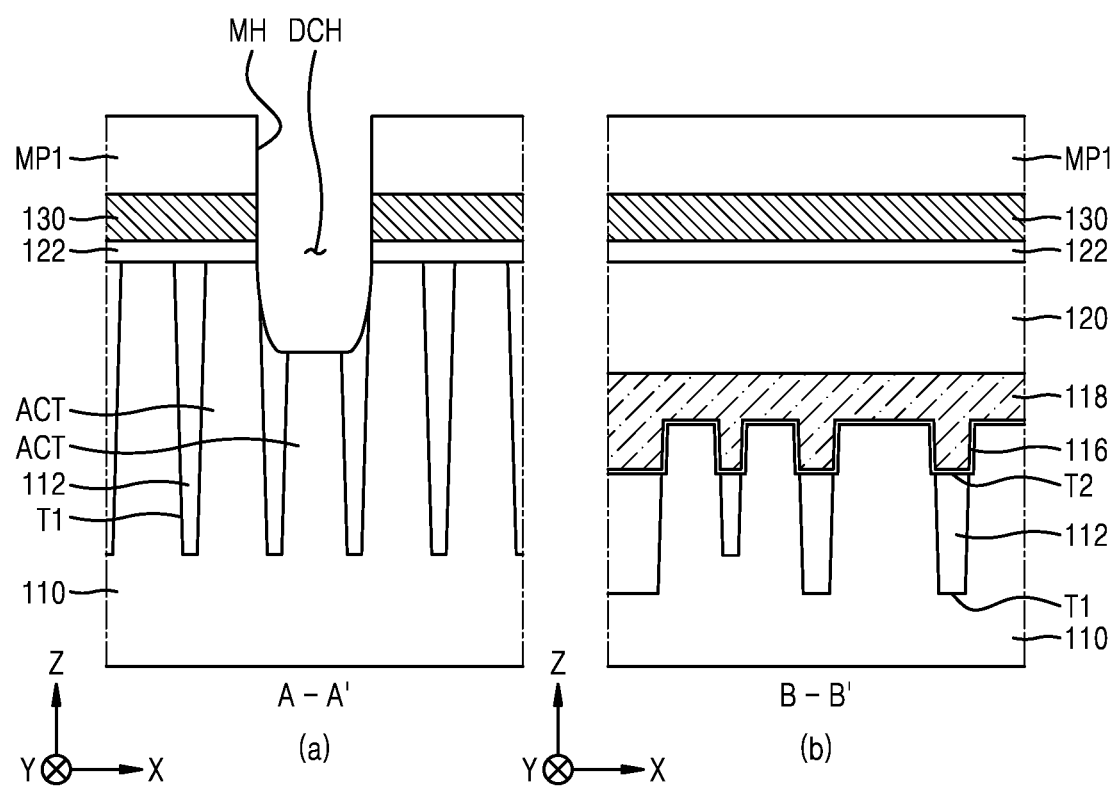
Figure 4C:
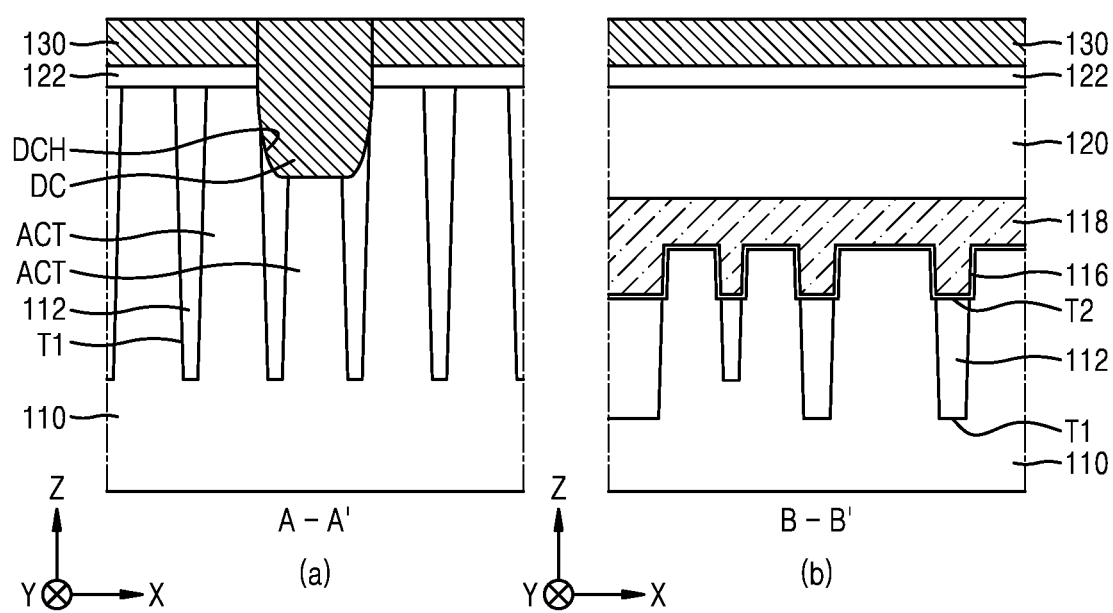
Figure 4D:
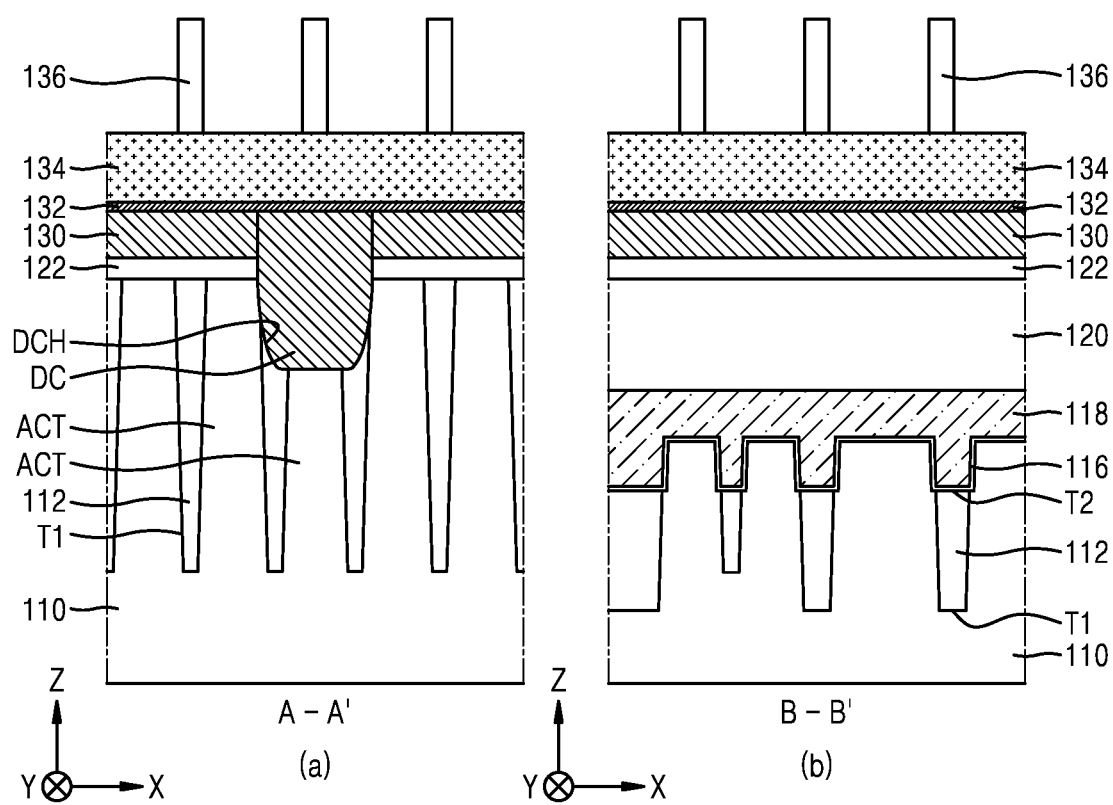
Figure 4E:
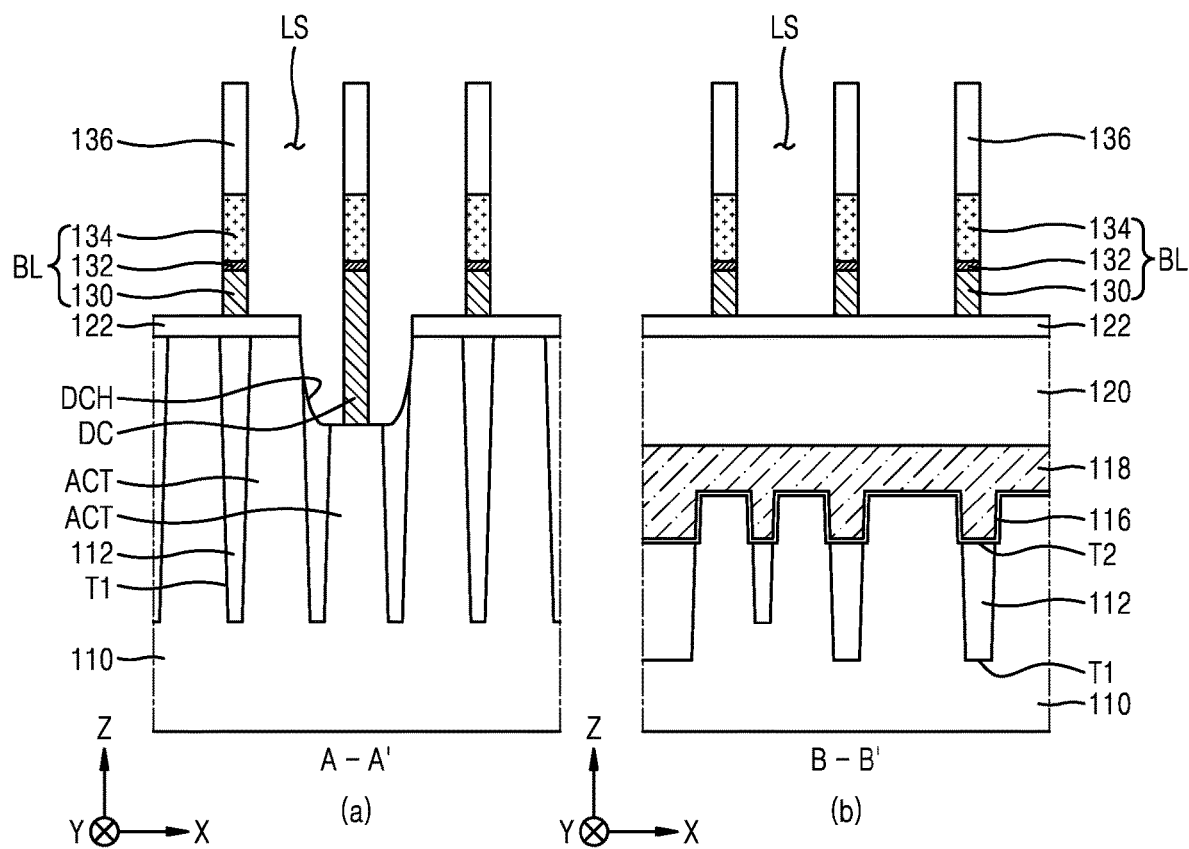
Figure 4F:
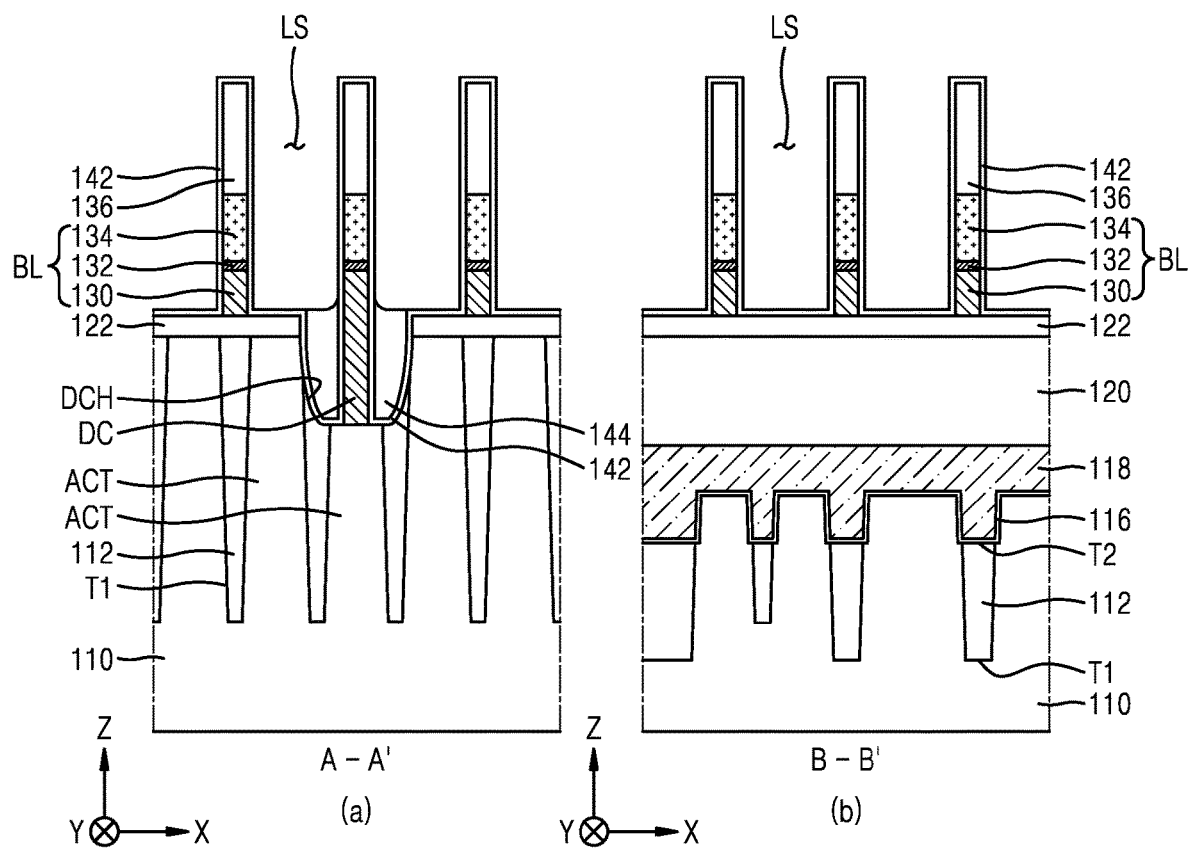
Figure 4G:
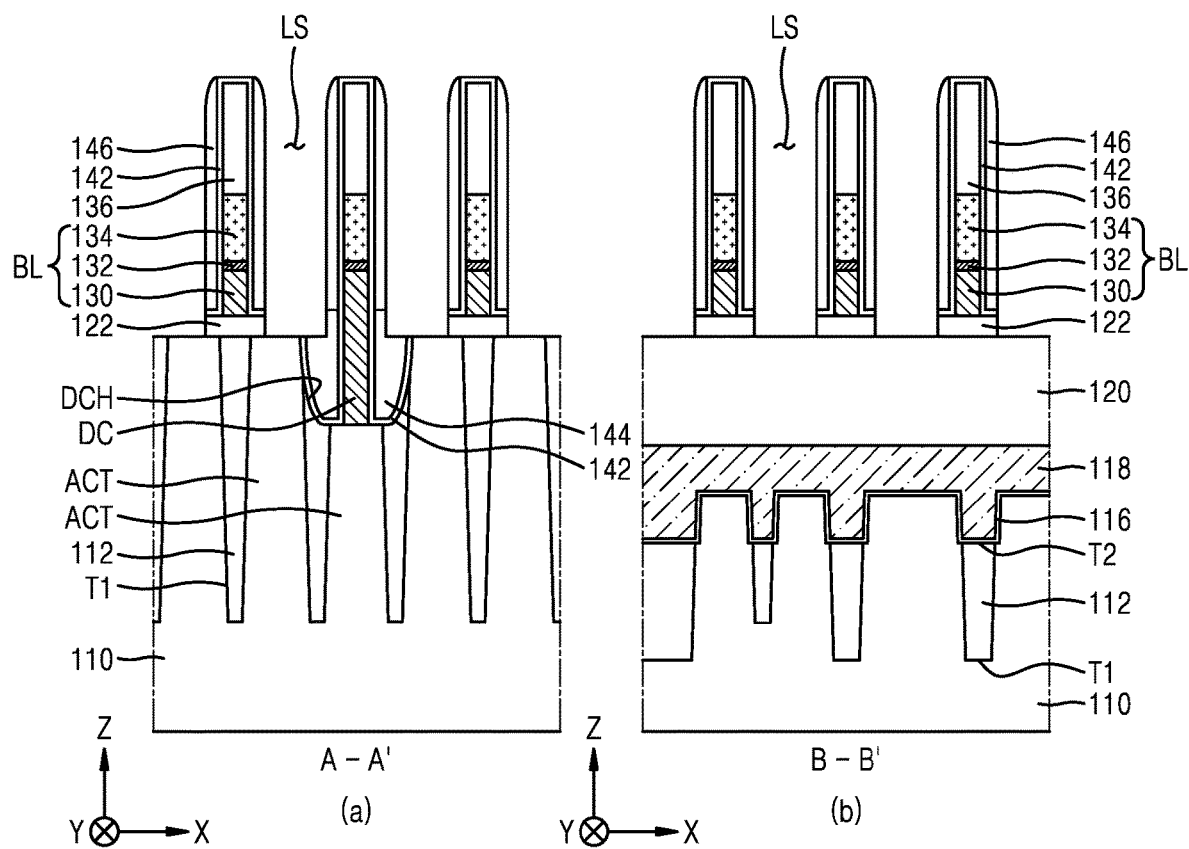
Figure 4H:
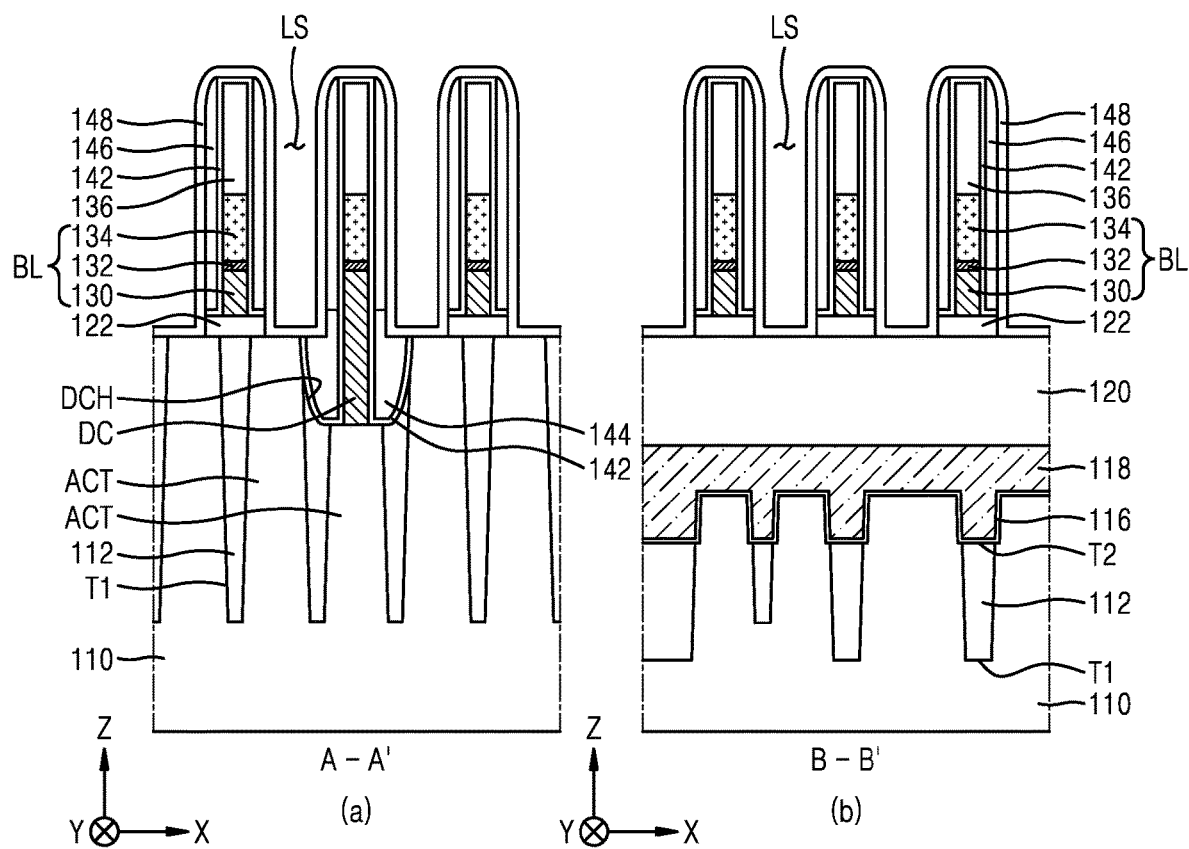
Figure 4I:
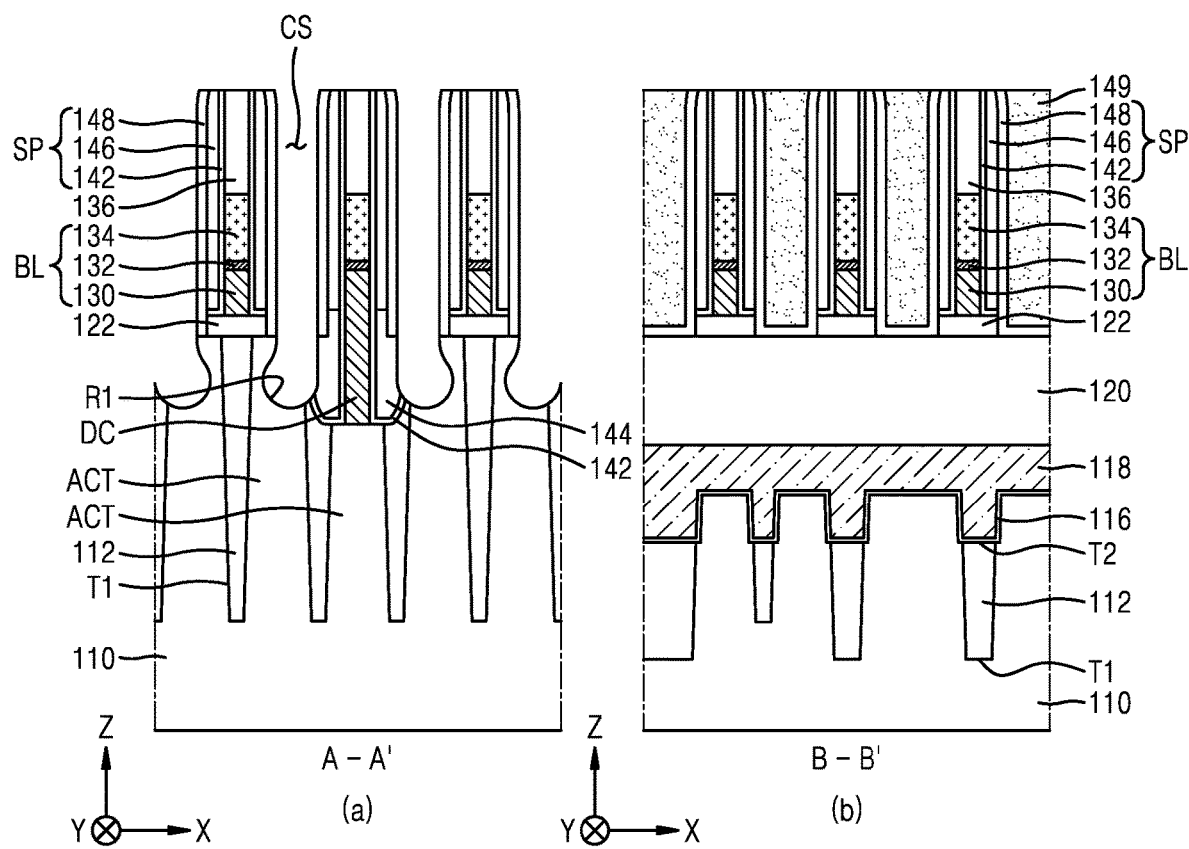
Figure 4J:
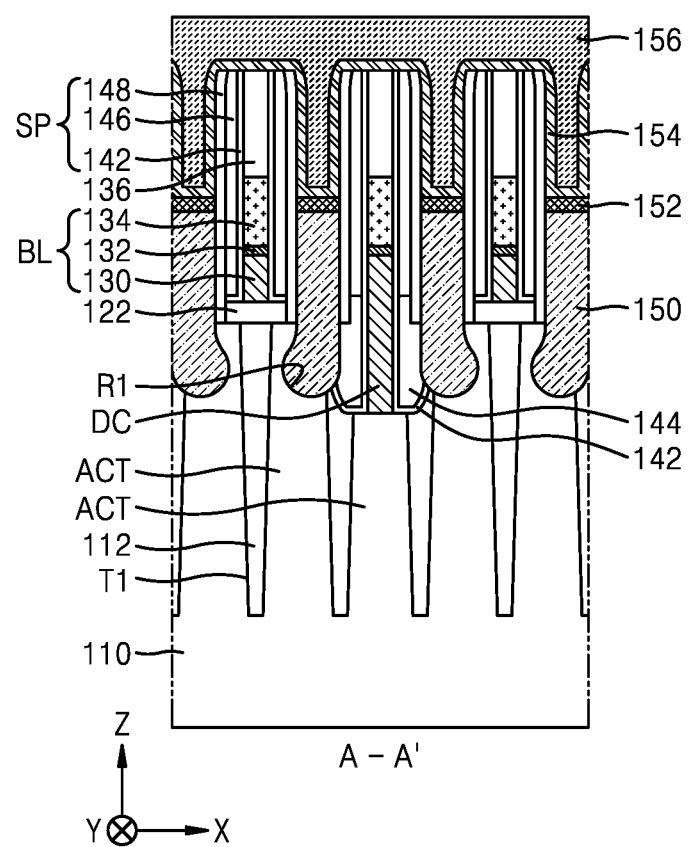
Figure 4K:
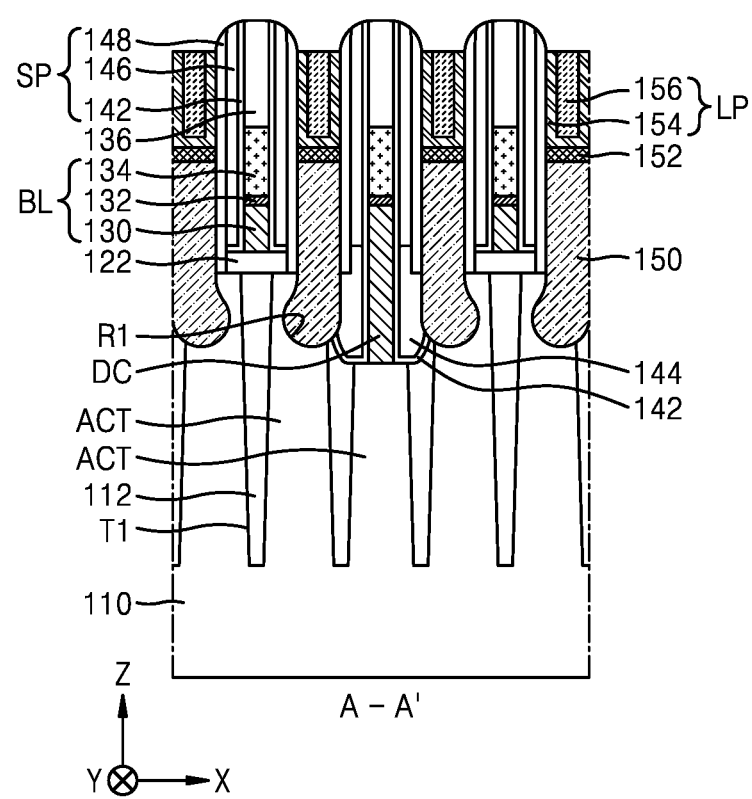
Figure 4L:
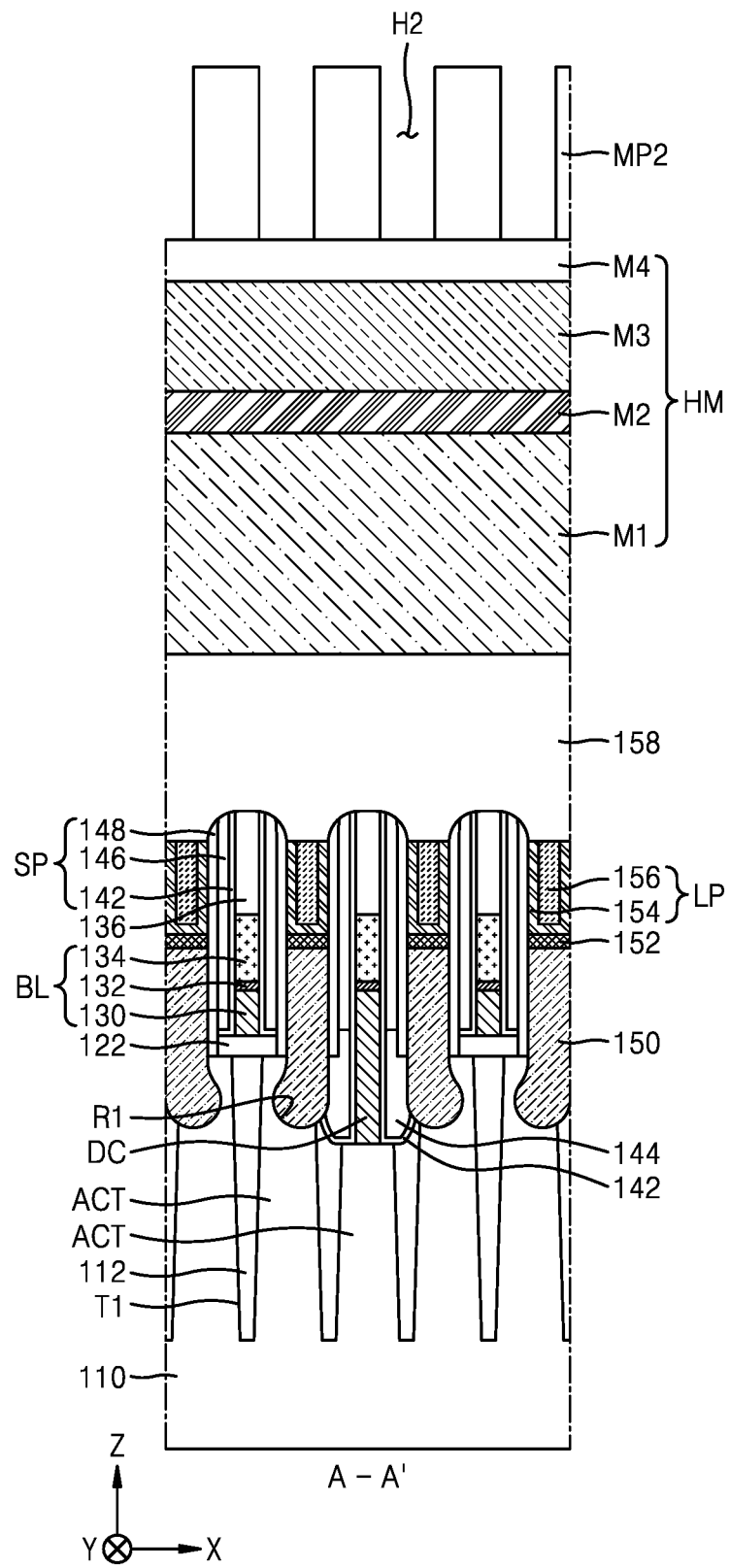
Figure 4M:
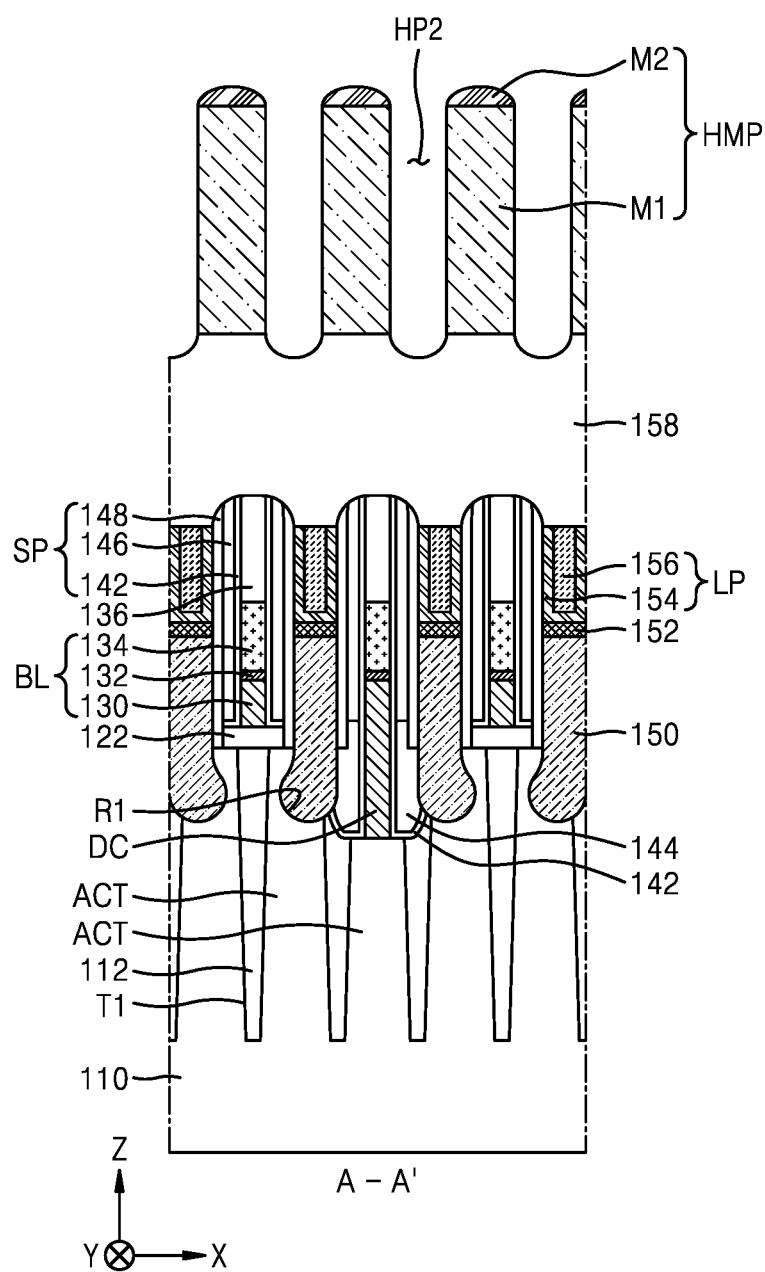
Figure 4N:
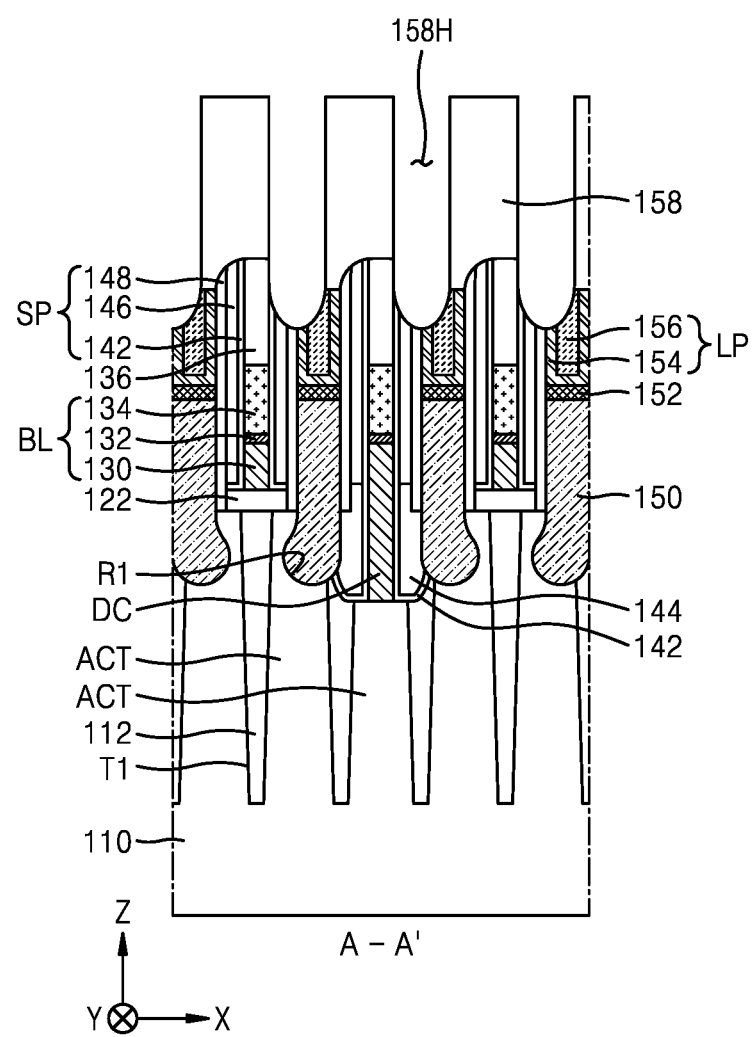
Figure 40:
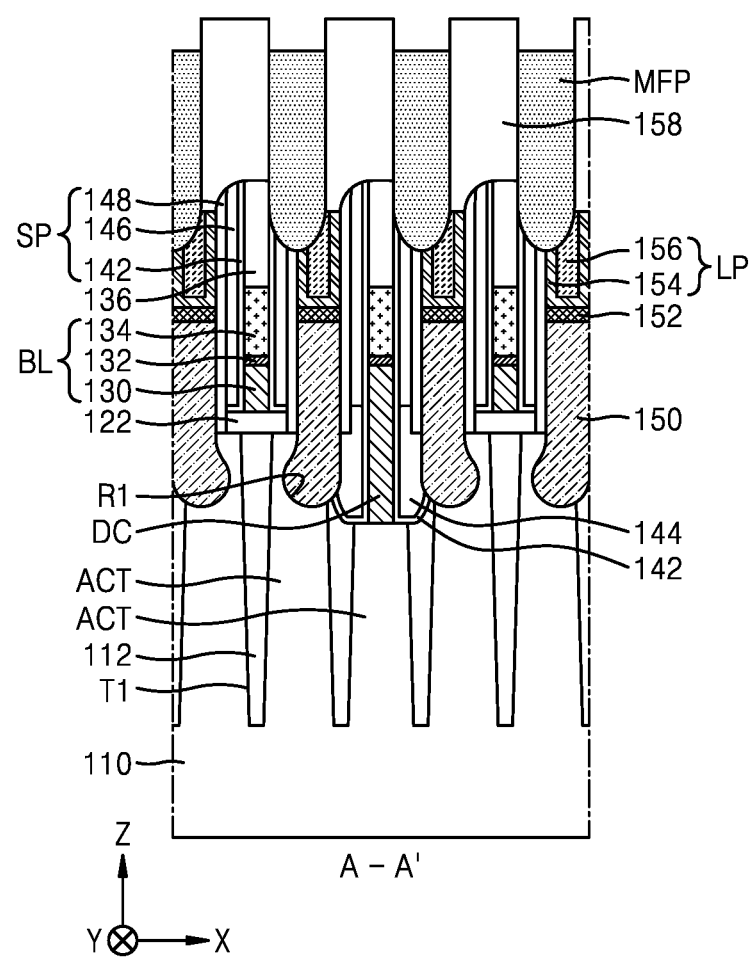
Figure 4P:
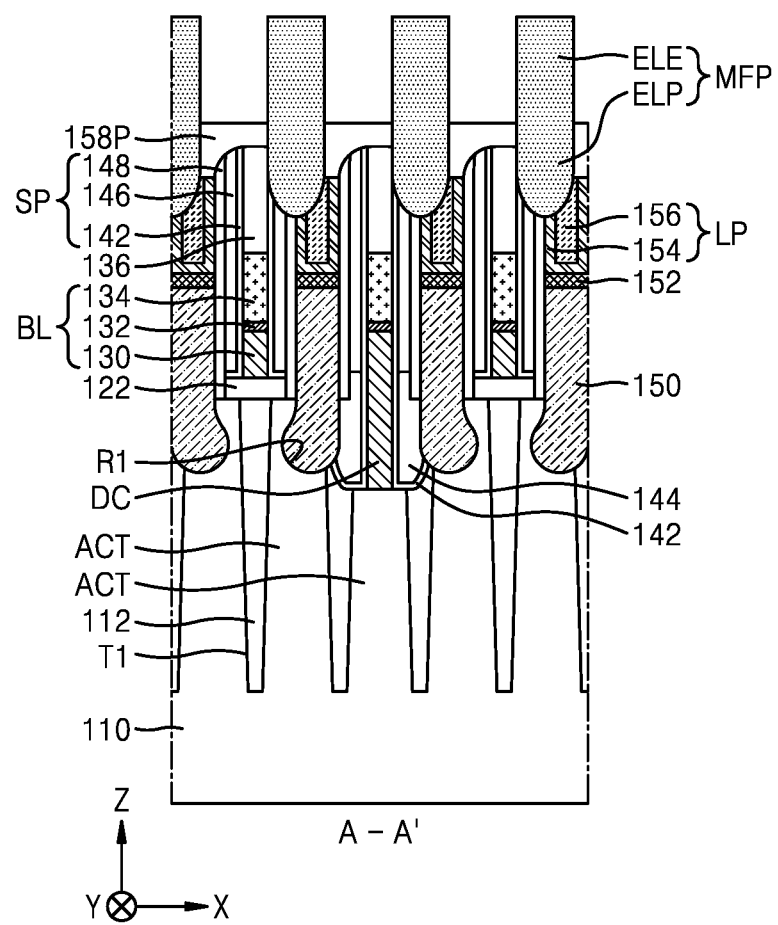
Figure 4Q:
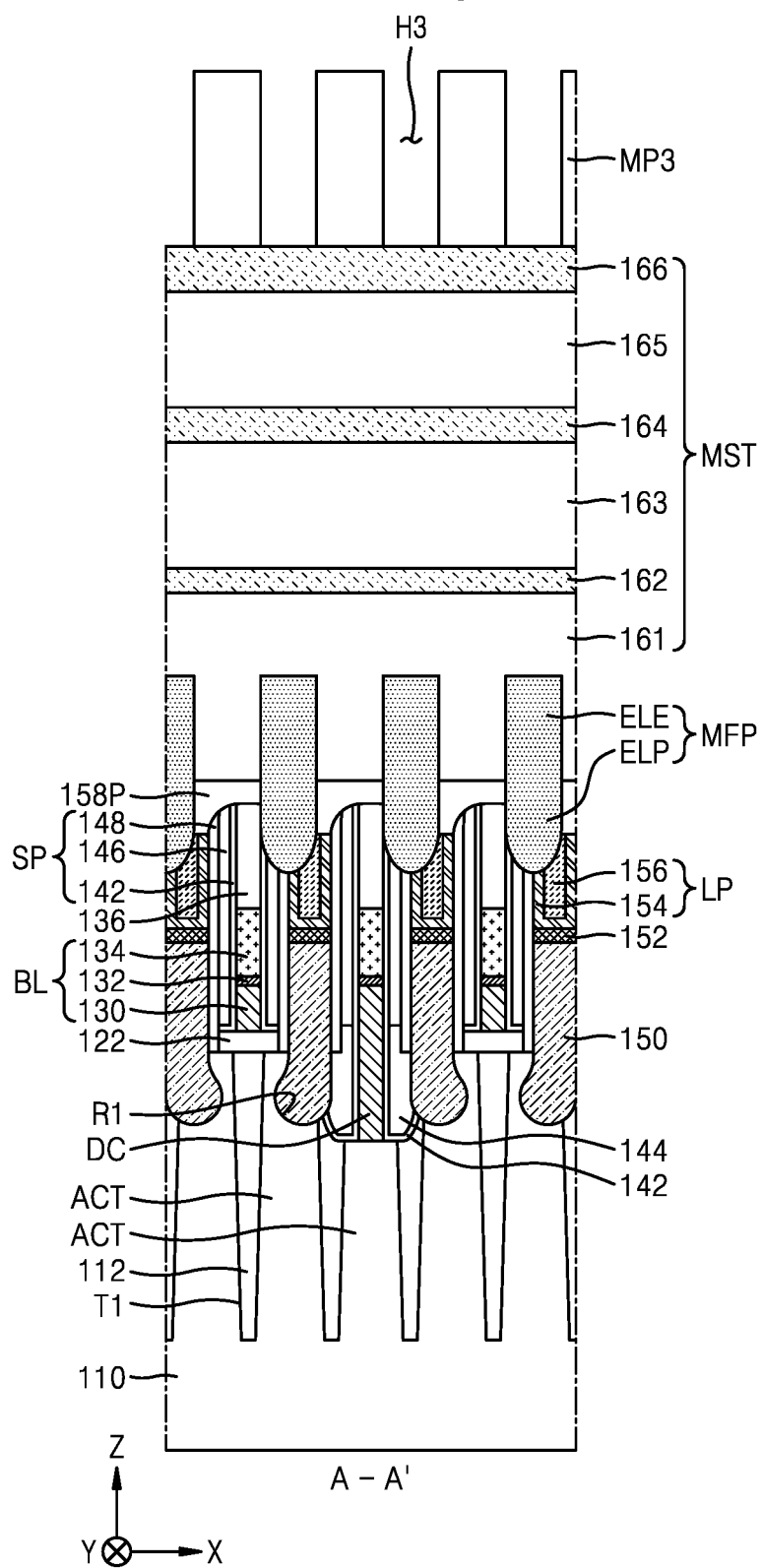
Figure 4R:
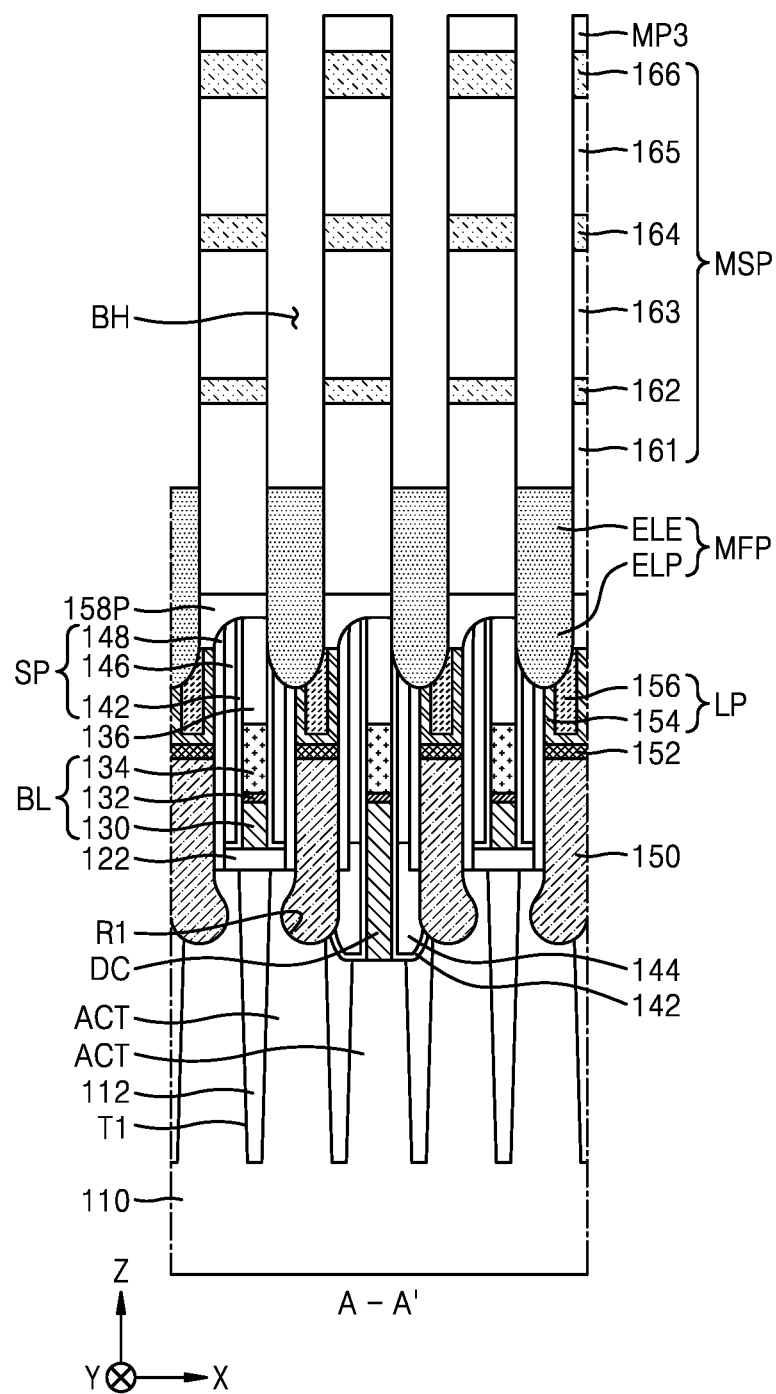
Figure 4S:
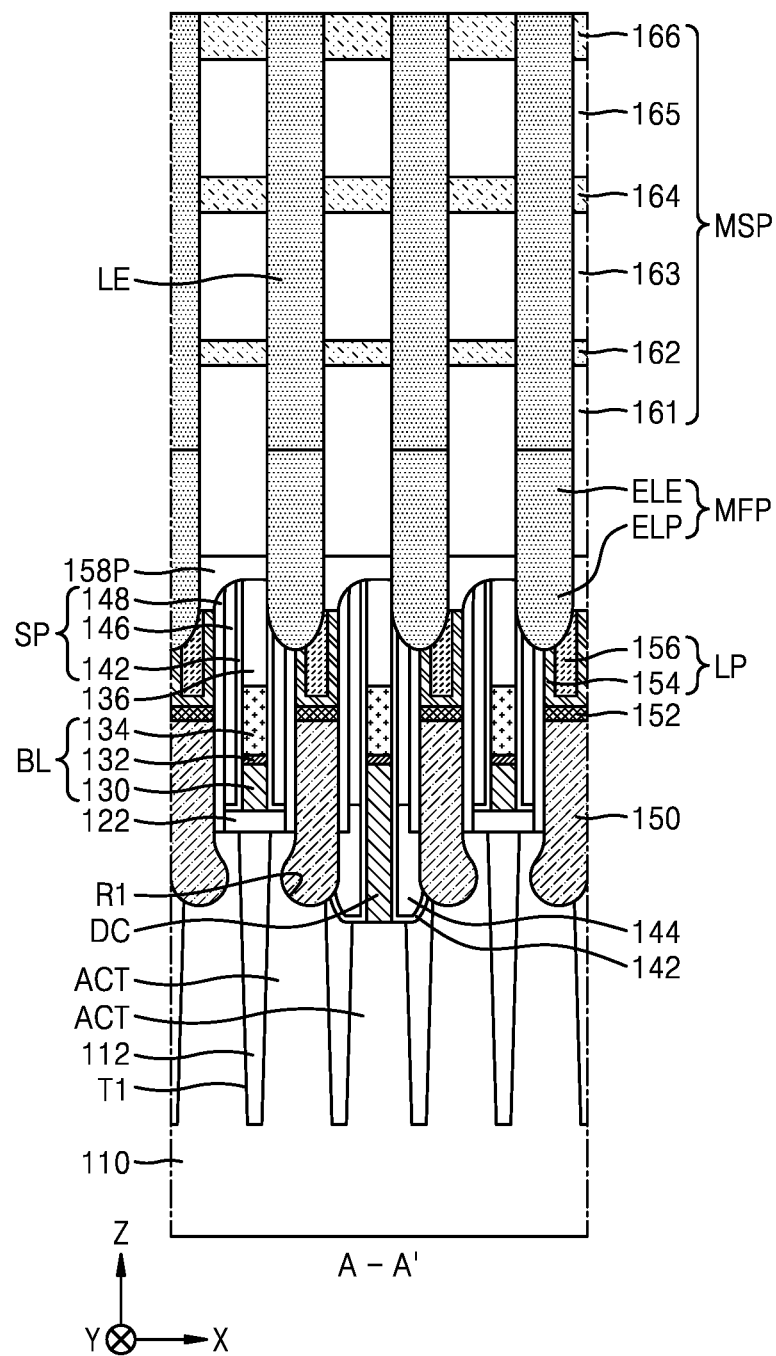
Figure 4T:
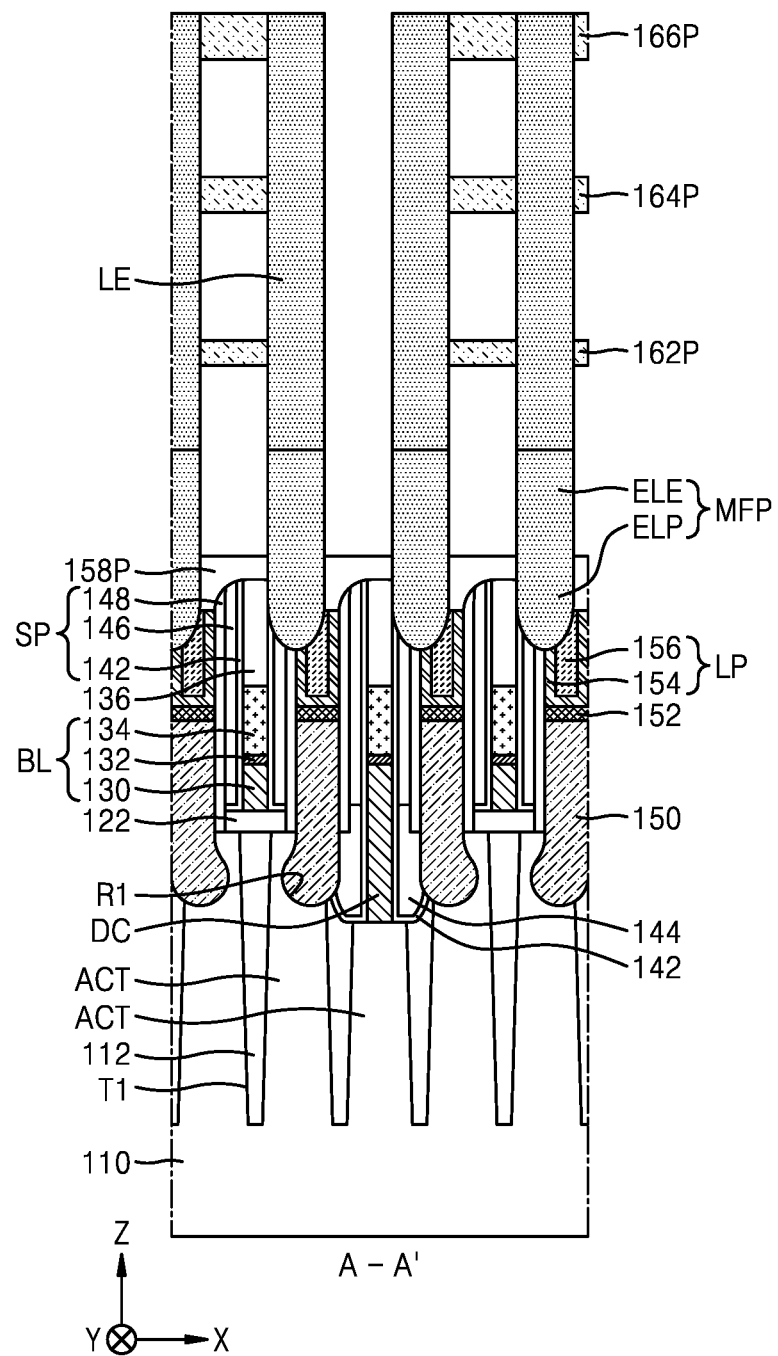
Figure 4U:
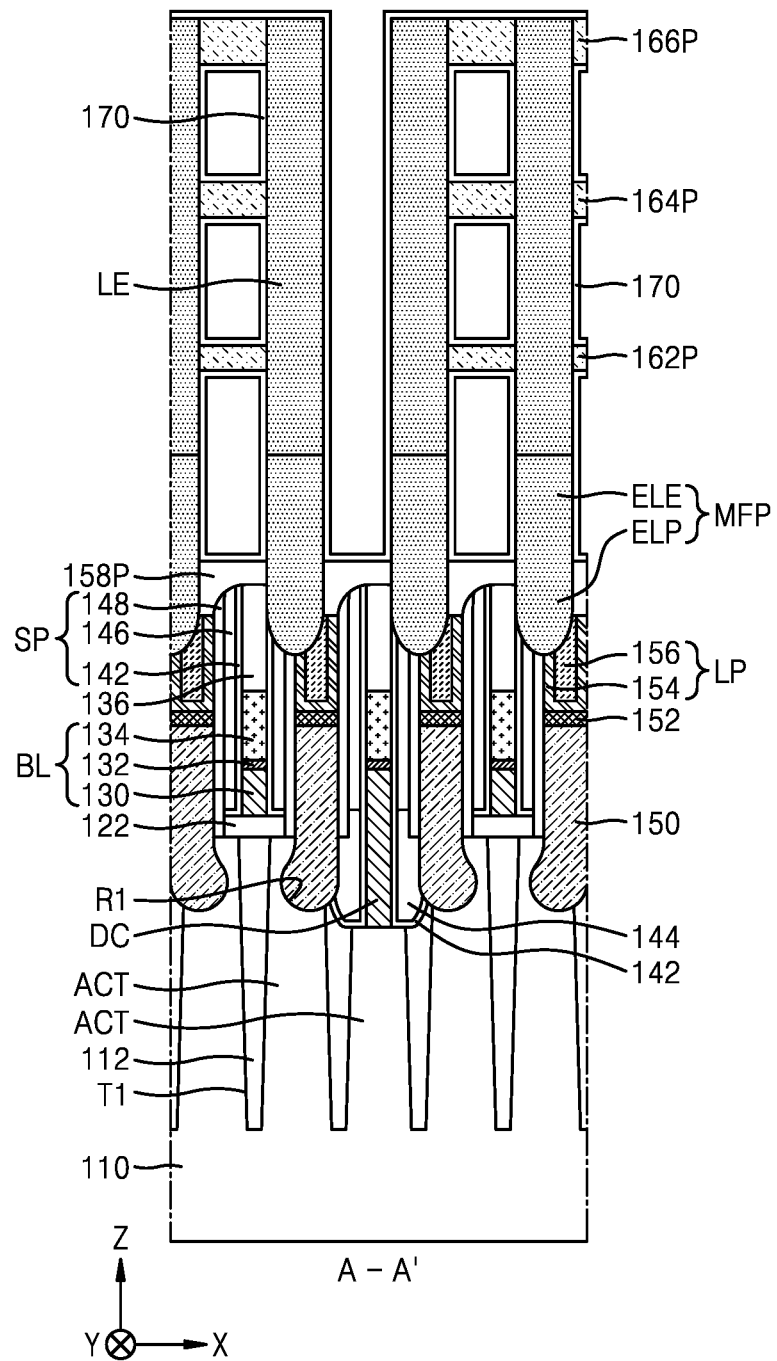
Figure 4V:
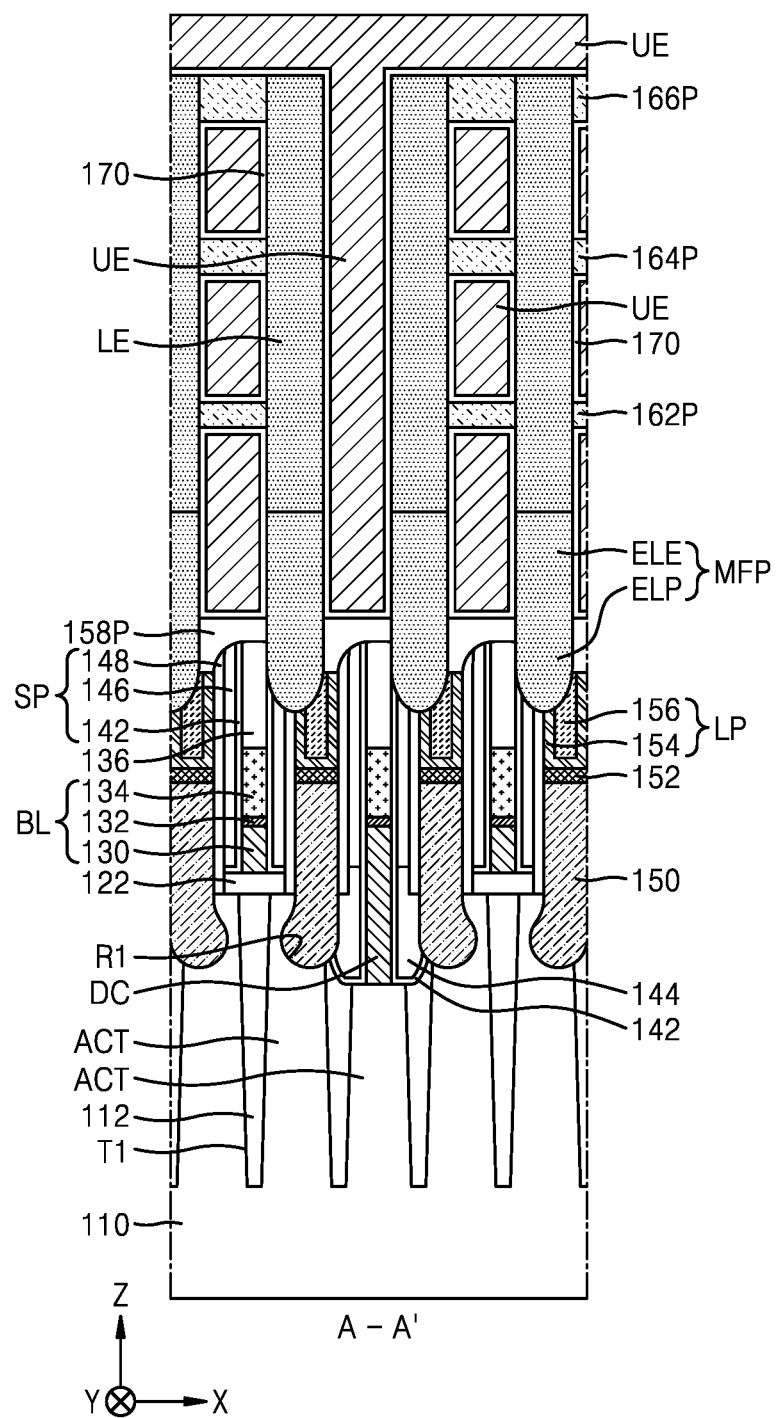

FIGS. 4A to 4V are cross-sectional views for describing a method of manufacturing an integrated circuit device, according to embodiments of the inventive concept. In FIGS. 4A to 4I, (a) shows a cross-sectional view of some components according to a process order in a partial area corresponding to the cross-section taken along line A-A' of FIG. 1, and (b) shows a cross-sectional view of some components in a part corresponding to a cross-section taken along line B-B' of FIG. 1. FIGS. 4J to 4V are cross-sectional views of some components after a process of FIG. 4I in the partial area corresponding to the cross-section taken along line A-A' of FIG. 1. A method of manufacturing the integrated circuit device 100 as shown in FIG. 2 is described with reference to FIGS. 4A to 4V. In FIGS. 4A to 4V, like reference numerals in FIG. 2 denote like members, and a repeated description thereof is omitted herein.

Referring to FIG. 4A, the device isolation trench T1 may be formed in the substrate 110, and the device isolation layer 112 may be formed inside the device isolation trench T1. The device isolation layer 112 may define each of the plurality of active regions ACT in the substrate 110.

A plurality of word line trenches T2 may be formed in the substrate 110. The plurality of word line trenches T2 may extend in parallel to each other in the first horizontal direction (X direction) and have a line shape crossing the active region ACT. To form the plurality of word line trenches T2 having level differences at lower surfaces thereof, the device isolation layer 112 and the substrate 110 may be etched in separate etching processes so that an etching depth of the device isolation layer 112 is different from an etching depth of the substrate 110. After cleaning the plurality of word line trenches T2, a gate dielectric layer 116, a word line 118, and a buried insulation layer 120 may be sequentially formed inside each of the plurality of word line trenches T2. The word line 118 may correspond to one of the plurality of word lines WL as shown in FIG. 1.

The gate dielectric layer 116 may include or may be formed of at least one selected from among a silicon oxide layer, a silicon nitride (SiN) layer, a silicon oxynitride (SiON) layer, an oxide/nitride/oxide (ONO) layer, and a high dielectric layer having a dielectric constant higher than a dielectric constant of the silicon oxide layer. The high dielectric layer may include or may be formed of $HfO_2$, $Al_2O_3$, hafnium aluminum oxide ($HfAlO_3$), $Ta_2O_3$, $TiO_2$, or a combination thereof. A plurality of word lines 118 may include or may be formed of Ti, TiN, Ta, TaN, W, WN, TiSiN, tungsten silicon nitride (WSiN), or a combination thereof. A plurality of buried insulation layers 120 may include or may be formed of a silicon oxide layer, a SiN layer, a SiON layer, or a combination thereof. Before or after forming the plurality of word lines 118, an ion injection process for forming a plurality of source/drain regions at the plurality of active regions ACT may be performed.

The buffer layer 122 and the lower conductive layer 130 may be sequentially formed on the substrate 110. The buffer layer 122 may be formed to cover the upper surfaces of the plurality of active regions ACT, the upper surface of the device isolation layer 112, and upper surfaces of the plurality of buried insulation layers 120. To form the buffer layer 122, a first silicon oxide layer, a SiN layer, and a second silicon oxide layer may be sequentially formed on the substrate 110, but the buffer layer 122 is not limited thereto. The lower conductive layer 130 may include or may be a doped polysilicon layer.

Referring to FIG. 4B, a mask pattern MP1 may be formed on the lower conductive layer 130, and then a direct contact hole DCH exposing the active region ACT of the substrate 110 therethrough may be formed by etching a portion of each of the lower conductive layer 130, the buffer layer 122, the substrate 110, and the device isolation layer 112 exposed through an opening MH of the mask pattern MP1. The mask pattern MP1 may include or may be an oxide layer, a nitride layer, or a combination thereof, but is not limited thereto.

Referring to FIG. 4C, the mask pattern MP1 may be removed from a structure of FIG. 4B, and the direct contact DC may be formed in the direct contact hole DCH.

To form the direct contact DC, a layer having a thickness enough to fill the direct contact hole DCH may be formed inside the direct contact hole DCH and on the lower conductive layer 130, and a part, which may be above an upper surface of the lower conductive layer 130, of the layer may be removed so that the layer remains only inside the direct contact hole DCH. The layer may include or may be a doped polysilicon layer. In example embodiments, the direct contact DC may include or may be formed of a polysilicon layer doped with an n-type dopant. The n-type dopant may be selected from among phosphorus (P), arsenic (As), and antimony (Sb).

Referring to FIG. 4D, the intermediate conductive layer 132, the upper conductive layer 134, and the plurality of insulating capping patterns 136 may be sequentially formed on the lower conductive layer 130 and the direct contact DC. Each of the plurality of insulating capping patterns 136 may include or may be a line pattern extending along a straight line extending in the second horizontal direction (Y direction).

Referring to FIG. 4E, from a structure of FIG. 4D, a portion of each of the upper conductive layer 134, the intermediate conductive layer 132, the lower conductive layer 130, and the direct contact DC may be etched by using the insulating capping pattern 136 as an etching mask, thereby forming the plurality of bit lines BL above the substrate 110. Each of the plurality of bit lines BL may include remaining parts (i.e., patterned parts) of each of the lower conductive layer 130, the intermediate conductive layer 132, and the upper conductive layer 134.

After forming the plurality of bit lines BL, a portion of the direct contact hole DCH may be exposed again around the direct contact DC, and a line space LS extending along a straight line extending in the second horizontal direction (Y direction) may be limited between every two adjacent bit lines of the plurality of bit lines BL.

Referring to FIG. 4F, the inner insulating spacer 142 conformally covering exposed surfaces of the structure of FIG. 4E may be formed, and the gap-fill insulating pattern 144 filling a remaining space of the direct contact hole DCH on the inner insulating spacer 142 may be formed.

The inner insulating spacer 142 may be formed to conformally cover the direct contact DC, the lower conductive layer 130, the intermediate conductive layer 132, the upper conductive layer 134, and each of the plurality of insulating capping patterns 136. The inner insulating spacer 142 may include or may be a SiN layer. To form the inner insulating spacer 142, a chemical vapor deposition (CVD) or atomic layer deposition (ALD) process may be used.

To form the gap-fill insulating pattern 144, a gap-fill insulating layer covering a side wall of each of the plurality of bit lines BL, the plurality of insulating capping patterns 136, and a plurality of direct contacts (DC) while filling the remaining space of the direct contact hole DCH on the inner insulating spacer 142 may be formed by using a CVD or ALD process. Thereafter, the gap-fill insulating layer may be isotropically etched to form the gap-fill insulating pattern 144 including a remaining part of the gap-fill insulating layer. The gap-fill insulating pattern 144 may include a part filling the inside of the direct contact hole DCH, and a part covering an entrance of the direct contact hole DCH from the outside of an entrance side of the direct contact hole DCH.

Referring to FIG. 4G, an intermediate insulating spacer layer conformally covering exposed surfaces of the structure of FIG. 4F may be formed by using a CVD or ALD process and then anisotropically etched to form a plurality of intermediate insulating spacers 146 from the intermediate insulating spacer layer.

During a time when the intermediate insulating spacer layer is isotropically etched to form the plurality of intermediate insulating spacers 146, a portion of the inner insulating spacer 142 and a portion of the buffer layer 122 may be removed. As a result, a portion of the substrate 110, a portion of the inner insulating spacer 142, and a portion of the gap-fill insulating pattern 144 may be exposed through a plurality of line spaces LS. Each of the plurality of intermediate insulating spacers 146 may cover a side wall of the bit line BL and a side wall of the insulating capping pattern 136 on the inner insulating spacer 142. In example embodiments, the plurality of intermediate insulating spacers 146 may include or may be a silicon oxide layer.

Referring to FIG. 4H, the outer insulating spacer 148 conformally covering the structure of FIG. 4G may be formed. To form the outer insulating spacer 148, a CVD or ALD process may be used.

Referring to 4I, from the structure of FIG. 4H, a plurality of insulating fences 149 separated from each other may be formed in line spaces LS limited by the outer insulating spacer 148 between the plurality of bit lines BL so that the line spaces LS are separated as a plurality of contact spaces CS.

Each of the plurality of insulating fences 149 may be formed to overlap the word line 118 in the vertical direction (Z direction) above the word line 118. The plurality of insulating fences 149 may include or may be a SiN layer. In example embodiments, during a time when the plurality of insulating fences 149 are formed, a portion of each of the plurality of insulating capping patterns 136 and insulating layers around the plurality of insulating capping patterns 136 may be consumed, thereby decreasing heights of the plurality of insulating capping patterns 136 and the insulating layers around the plurality of insulating capping patterns 136. The plurality of contact spaces CS may be disposed between two adjacent insulating fences 149 among the plurality of insulating fences 149.

Thereafter, a portion of structures exposed through the plurality of contact spaces CS may be removed to form the plurality of recess spaces R1 exposing the plurality of active regions ACT of the substrate 110 between every two of the plurality of bit lines BL. To form the plurality of recess spaces R1, an anisotropic etching process or a combination of an anisotropic etching process and an isotropic etching process may be used. For example, the plurality of recess spaces R1 may be formed by anisotropically etching the outer insulating spacer 148 exposed at the bottoms of the plurality of contact spaces CS between every two of the plurality of bit lines BL and a portion of the substrate 110 under the outer insulating spacer 148 and isotropically etching a portion of the active region ACT of the substrate 110, which is exposed as a result of the anisotropic etching. For example, an anisotropic etching may be followed by an isotropic etching process. Each of the plurality of recess spaces R1 may be connected to a corresponding contact space among the plurality of contact spaces CS. During a time when an etching process is performed to form the plurality of recess spaces R1, a portion of each of the inner insulating spacer 142 and the gap-fill insulating pattern 144 may be consumed in a region adjacent to the upper surface of the substrate 110.

A portion of the active region ACT of the substrate 110, a portion of the inner insulating spacer 142, and a portion of the gap-fill insulating pattern 144 may be exposed through the plurality of recess spaces R1. After forming the plurality of recess spaces R1, the inner insulating spacer 142, the intermediate insulating spacer 146, and the outer insulating spacer 148 remaining on opposite sidewalls of the bit line BL may constitute the spacer structure SP.

Referring to FIG. 4J, from the result of FIG. 4I, the plurality of contact plugs 150 filling the plurality of recess spaces R1 and portions of the plurality of contact spaces (CS, see FIG. 4I) between every two of the plurality of bit lines BL may be formed. The plurality of metal silicide layers 152 may be formed on the plurality of contact plugs 150. The conductive barrier layer 154 and the metal layer 156 covering the insulating capping patterns 136 and the spacer structures SP may be formed on the metal silicide layers 152. The conductive barrier layer 154 and the metal layer 156 may be sequentially formed to fill a remaining space of each of the plurality of contact spaces CS.

Referring to FIG. 4K, from the structure of FIG. 4J, the metal layer 156 and the conductive barrier layer 154 may be etched back to form the plurality of conductive landing pads LP each including the metal layer 156 and the conductive barrier layer 154 remaining only in the plurality of contact spaces (CS, see FIG. 4I).

During a time when the metal layer 156 and the conductive barrier layer 154 are etched back, portions of the insulating capping patterns 136 and portions of the spacer structures SP may be consumed. The vertical level of the uppermost surface of the plurality of conductive landing pads LP may be lower than a vertical level of the uppermost surface of each of the insulating capping patterns 136 and the spacer structures SP adjacent to the plurality of conductive landing pads LP. In an embodiment, upper surfaces of the plurality of conductive landing pads LP may be lower than upper surfaces of the plurality of insulating capping patterns 136. An upper surface of each of the plurality of spacer structures SP may connect an upper surface of a corresponding conductive landing pad of the conductive landing pads LP and an upper surface of a corresponding insulating capping pattern of the insulating capping patterns 136.

In example embodiments, after forming the plurality of conductive landing pads LP in a process as described with reference to FIG. 4K, a process of substituting an air spacer for at least a portion of a silicon oxide layer constituting the plurality of intermediate insulating spacers 146 may be further included.

Referring to FIG. 4L, a guide insulation layer 158 may be formed on the structure of FIG. 4K, a hardmask structure HM may be formed on the guide insulation layer 158, and a mask pattern MP2 may be formed on the hardmask structure HM.

The guide insulation layer 158 may be formed to be in contact with the insulating capping pattern 136, the spacer structure SP, and the conductive landing pad LP. The guide insulation layer 158 may include or may be a SiN layer.

The hardmask structure HM may include or may be a stack structure of a plurality of hardmask layers including different materials. In example embodiments, the hardmask structure HM may include a first hardmask layer M1, a second hardmask layer M2, a third hardmask layer M3, and a fourth hardmask layer M4 sequentially stacked on the guide insulation layer 158. For example, the first hardmask layer M1 may include or may be an amorphous carbon layer (ACL), the second hardmask layer M2 may include or may be formed of amorphous polysilicon, the third hardmask layer M3 may include or may be formed of a spin on hardmask (SOH) material, and the fourth hardmask layer M4 may include or may be formed of SiON, but the hardmask structure HM is not limited thereto.

The mask pattern MP2 may include or may be a photoresist pattern. A plurality of holes H2 may be formed in the mask pattern MP2.

Referring to FIG. 4M, from the structure of FIG. 4L, the fourth hardmask layer M4, the third hardmask layer M3, the second hardmask layer M2, and the first hardmask layer M1 may be sequentially etched by using the mask pattern MP2 as an etching mask, to form a hardmask pattern HMP including an etching result of each of the first hardmask layer M1 and the second hardmask layer M2 on the guide insulation layer 158. A plurality of holes HP2 corresponding to the plurality of holes (H2, see FIG. 4L) may be formed in the hardmask pattern HMP. During a time when the hardmask pattern HMP is formed, an upper surface of the guide insulation layer 158, which is exposed in each of the plurality of holes HP2, may be partially consumed.

Referring to FIG. 4N, from the structure of FIG. 4M, the guide insulation layer 158 may be etched by using the hardmask pattern HMP as an etching mask, and a portion of each of parts of the conductive landing pad LP, the spacer structure SP, and the insulating capping pattern 136 under the guide insulation layer 158, which are exposed after etching the guide insulation layer 158, may be removed. As a result, a plurality of holes 158H passing through the guide insulation layer 158 may be formed, and the conductive landing pad LP, the spacer structure SP, and the insulating capping pattern 136 may be exposed through the plurality of holes 158H.

The guide insulation layer 158 including the plurality of holes 158H may function, in a subsequent process, to determine a vertical-direction (Z-direction) length of the extended lower electrode portion ELE included in each of the plurality of conductive multifunction plugs (MFP, see FIGS. 4O and 4P) after forming the plurality of conductive multifunction plugs MFP filling the plurality of holes 158H.

Referring to FIG. 4O, from the result of FIG. 4N, a conductive layer covering the upper surface of the guide insulation layer 158 while filling the plurality of holes 158H may be formed, and then, the conductive layer may be etched back to form the plurality of conductive multifunction plugs MPF remaining in the plurality of holes 158H.

Referring to FIG. 4P, the guide insulation layer 158 may be selectively etched back to form the guide insulation pattern 158P having the upper surface of the vertical level lower than the vertical level of the uppermost surface of each of the plurality of conductive multifunction plugs MFP. In an embodiment, the selective etching of the guide insulation layer 158 may lower a height of the guide insulation layer 158 to form the guide insulation pattern 158P. After forming the guide insulation pattern 158P, a structure in which the plurality of conductive multifunction plugs MFP protrude upward from the vertical level of the upper surface of the guide insulation pattern 158P may be obtained. Each of parts of the plurality of conductive multifunction plugs MFP, which protrude from the upper surface of the guide insulation pattern 158P, may constitute the extended lower electrode portion ELE. Each of parts of the plurality of conductive multifunction plugs MFP, which are lower than the vertical level of the upper surface of the guide insulation pattern 158P, may constitute the extended landing pad portion ELP.

When the guide insulation layer 158 is selectively etched back, a vertical-direction (Z-direction) length of each of the parts of the plurality of conductive multifunction plugs MFP, which protrude from the upper surface of the guide insulation pattern 158P, may be controlled to determine the vertical-direction (Z-direction) length of the extended lower electrode portion ELE. For example, the more the guide insulation layer 158 is selectively etched, the greater the length of the extended lower electrode portion ELE may be.

Referring to FIG. 4Q, a mold structure MST may be formed on the structure of FIG. 4P, and a mask pattern MP3 may be formed on the mold structure MST.

The mold structure MST may include a plurality of mold layers and a plurality of support layers. For example, the mold structure MST may include a first mold layer 161, a first support layer 162, a second mold layer 163, a second support layer 164, a third mold layer 165, and a third support layer 166 sequentially stacked on the guide insulation pattern 158P and the plurality of conductive multifunction plugs MFP.

In example embodiments, each of the first mold layer 161, the second mold layer 163, and the third mold layer 165 may include or may be an oxide layer, a nitride layer, or a combination thereof. Each of the first support layer 162, the second support layer 164, and the third support layer 166 may include or may be a SiN layer, a SiCN layer, a SiBN layer, or a combination thereof.

The mask pattern MP3 may include or may be a nitride layer, an oxide layer, a polysilicon layer, a photoresist layer, or a combination thereof. A plurality of holes H3 may be formed in the mask pattern MP3.

Referring to FIG. 4R, from the structure of FIG. 4Q, the mold structure MST may be anisotropically etched by using the mask pattern MP3 as an etching mask and using the plurality of conductive multifunction plugs MFP as an etching stop layer, to form a mold structure pattern MSP defining a plurality of holes BH. A portion of the mask pattern MP3 may be consumed during a time when an etching process is performed to form the plurality of holes BH.

Referring to FIG. 4S, the mask pattern MP3 may be removed from the structure of FIG. 4R, and the plurality of lower electrodes LE filling the plurality of holes BH may be formed.

In example embodiments, to form the plurality of lower electrodes LE, a conductive layer covering the upper surface of the guide insulation pattern 158P while filling the plurality of holes BH may be formed on the structure of FIG. 4R. To form the conductive layer, a CVD, plasma-enhanced CVD (PECVD), metal organic CVD (MOCVD), or ALD process may be used. Thereafter, a portion of the conductive layer may be removed by using an etchback process or a chemical mechanical polishing (CMP) process, to expose an upper surface of the third support layer 166. In an embodiment, the plurality of lower electrodes LE may contact the plurality of conductive multifunction plugs MFP, respectively.

Referring to FIG. 4T, from the structure of FIG. 4S, the third support pattern 166P may be formed by removing a portion of the third support layer 166. The third mold layer 165 exposed as a result of removing the portion of the third support layer 166 may be removed in a wet manner (e.g., a wet etching). In an embodiment, the third mold layer 165 may be entirely removed in a wet etching. The second support pattern 164P may be formed by removing a portion of the second support layer 164, and the second mold layer 163 exposed as a result of removing the portion of the second support layer 164 may be removed in a wet manner (e.g., a wet etching). In an embodiment, the second mold layer 163 may be entirely removed in a wet etching. The first support pattern 162P may be formed by removing a portion of the first support layer 162, and the first mold layer 161 exposed as a result of removing the portion of the first support layer 162 may be removed in a wet manner (e.g., a wet etching). In an embodiment, the first mold layer 161 may be entirely removed in a wet etching. After removing the first mold layer 161, the second mold layer 163, and the third mold layer 165, sidewalls of the plurality of lower electrodes LE and the upper surface of the guide insulation pattern 158P may be exposed. In example embodiments, to remove the first mold layer 161, the second mold layer 163, and the third mold layer 165 in a wet manner (e.g., a wet etching), an LAL solution including ammonium fluoride ($NH_4F$), hydrofluoric (HF) acid, and water, may be used, but the inventive concept is not limited thereto.

Referring to FIG. 4U, the dielectric layer 170 covering exposed surfaces of the result of FIG. 4T may be formed. To form the dielectric layer 170, an ALD process may be used.

Referring to FIG. 4V, the upper electrode UE covering the dielectric layer 170 may be formed on the structure of FIG. 4U to manufacture the integrated circuit device 100 shown in FIG. 2. In example embodiments, to form the upper electrode UE, a CVD, MOCVD, physical vapor deposition (PVD), or ALD process may be used. In an embodiment, the plurality of lower electrodes LE, and the upper electrode UE, and the dielectric layer 170 disposed therebetween may form capacitors. In an embodiment, the upper electrode UE may be shared or commonly used by the capacitors.

To manufacture the integrated circuit device 200 shown in FIG. 3, the same processes as described with reference to FIGS. 4A to 4V may be used. However, in the process described with reference to FIG. 4O, the plurality of conductive multifunction plugs MPF2 may be formed instead of the plurality of conductive multifunction plugs MFP.

According to the method of manufacturing an integrated circuit device, according to embodiments of the inventive concept, which has been described with reference to FIGS. 4A to 4V, as described with reference to FIGS. 4N and 4O, the vertical-direction (Z-direction) length of the extended lower electrode portion ELE in each of the plurality of conductive multifunction plugs MPF may be determined by forming the plurality of holes 158H in the guide insulation layer 158, then forming the plurality of conductive multifunction plugs MFP filling the plurality of holes 158H, and then controlling an etching depth of the guide insulation layer 158 by etchback.

In addition, when forming the extended lower electrode portion ELE of each of the plurality of conductive multifunction plugs MFP, a lift-off process using a wet etching solution, which may cause fracture of the plurality of conductive multifunction plugs MFP in a relatively narrow and long pillar shape, is not used. Therefore, a height of a part of each of the plurality of conductive multifunction plugs MFP, which may be used as the extended lower electrode portion ELE, may be easily increased.

In the integrated circuit device 100 or 200 formed by the method of manufacturing an integrated circuit device, according to embodiments of the inventive concept, which has been described with reference to FIGS. 4A to 4V, the extended lower electrode portion ELE or ELE2 of each of the plurality of conductive multifunction plugs MFP or MFP2 may perform the same function as the lower electrode LE. Therefore, the extended lower electrode portion ELE or ELE2 may increase a height of a substantial lower electrode portion constituting the capacitor CP1 or CP2. The extended landing pad portion ELP or ELP2 of each of the plurality of conductive multifunction plugs MFP or MFP2 may perform the same function as the conductive landing pad LP. Accordingly, even when a size of the capacitor CP1 or CP2 is reduced according to miniaturization of the integrated circuit device 100 or 200, the height of the lower electrode portion of the capacitor CP1 or CP2 including the extended lower electrode portion ELE or ELE2 and the lower electrode LE may increase by a method with reduced technical difficulty, thereby maintaining an increased capacitance and excellent electrical characteristics. In an embodiment, the extended lower electrode portion ELE or ELE2 and the extended landing pad portion ELP or ELP2 may be formed at the same time.

While the inventive concept has been particularly shown and described with reference to embodiments thereof, it will be understood that various changes in form and details may be made therein without departing from the spirit and scope of the following claims.

What is claimed is:

1. An integrated circuit device comprising:
a substrate having an active region;
a conductive landing pad at a first vertical level above the substrate and connected to the active region;
a capacitor including a lower electrode at a second vertical level higher than the first vertical level above the substrate; and
a conductive multifunction plug comprising:
an extended landing pad portion at a third vertical level between the first vertical level and the second vertical level and contacting the conductive landing pad, and
an extended lower electrode portion integrally connected to the extended landing pad portion and contacting the lower electrode,
wherein the capacitor further includes a dielectric layer covering a surface of the lower electrode and the extended lower electrode portion of the conductive multifunction plug.

2. The integrated circuit device of claim 1, further comprising:

a contact plug contacting the active region and connected to the lower electrode via the conductive multifunction plug;

a bit line adjacent to the contact plug in a first horizontal direction and extending above the substrate in a second horizontal direction perpendicular to the first horizontal direction;

an insulating capping pattern covering an upper surface of the bit line; and a guide insulation pattern on the insulating capping pattern and contacting the extended landing pad portion of the conductive multifunction plug, wherein an uppermost surface of the guide insulation pattern is closer to the substrate than an uppermost surface of the conductive multifunction plug, and wherein the uppermost surface of the guide insulation pattern is coplanar with an upper surface of the extended landing pad portion.

3. The integrated circuit device of claim 1, further comprising:

a bit line above the substrate;

an insulating capping pattern covering an upper surface of the bit line; and an insulating spacer covering opposite sidewalls of each of the bit line and the insulating capping pattern, wherein the conductive multifunction plug contacts at least one of the insulating capping pattern and the insulating spacer.

4. The integrated circuit device of claim 1, further comprising:

an upper electrode facing each of the lower electrode and the extended lower electrode portion with the dielectric layer therebetween; and an interface between the extended lower electrode portion and the lower electrode, wherein a vertical level of the interface between the extended lower electrode portion and the lower electrode is higher than a vertical level of a lowermost surface of the upper electrode.

5. The integrated circuit device of claim 1, wherein the conductive multifunction plug and the lower electrode include the same metal.

6. The integrated circuit device of claim 1, wherein the conductive multifunction plug and the lower electrode include different metals.

7. The integrated circuit device of claim 1, wherein the conductive landing pad and the conductive multifunction plug include the same metal.

8. The integrated circuit device of claim 1, wherein the conductive landing pad and the conductive multifunction plug include different metals.

9. The integrated circuit device of claim 1, wherein a length of the extended lower electrode portion in a vertical direction is greater than a length of the extended landing pad portion in the vertical direction.

10. The integrated circuit device of claim 1, wherein the conductive landing pad has a first pillar shape extending along a first vertical straight line extending in a vertical direction, wherein the conductive multifunction plug has a second pillar shape extending along a second vertical straight line extending in the vertical direction, and wherein the first vertical straight line is spaced apart from the second vertical straight line in a horizontal direction.

11. The integrated circuit device of claim 1, further comprising:

a support pattern contacting the lower electrode to support the lower electrode, wherein a vertical level of an interface between the conductive multifunction plug and the lower electrode is closer to the substrate than a vertical level of the support pattern.

12. An integrated circuit device comprising:

a plurality of bit line structures above a substrate to be parallel with each other;

a plurality of contact structures arranged in spaces between two adjacent bit line structures of the plurality of bit line structures, wherein each contact structure has a first pillar shape extending along a first straight line extending in a vertical direction;

a plurality of conductive multifunction plugs on the plurality of contact structures, respectively, wherein each conductive multifunction plug of the plurality of conductive multifunction plugs has a lower surface contacting a corresponding contact structure among the plurality of contact structures and a second pillar shape extending along a second straight line extending in the vertical direction, and the second straight line is spaced apart from the first straight line in a horizontal direction; and a plurality of capacitors including a plurality of lower electrodes disposed on the plurality of conductive multifunction plugs, respectively, wherein each lower electrode of the plurality of lower electrodes has a lower surface contacting a corresponding conductive multifunction plug among the plurality of conductive multifunction plugs, and wherein the plurality of capacitors further include a dielectric layer covering a surface of each of the plurality of lower electrodes and an upper-side surface of each of the plurality of conductive multifunction plugs.

13. The integrated circuit device of claim 12, wherein each of the plurality of contact structures comprises:

a contact plug including a conductive semiconductor pattern contacting an active region of the substrate;

a metal silicide layer covering an upper surface of the contact plug; and a conductive landing pad covering an upper surface of the metal silicide layer, wherein each of the plurality of conductive multifunction plugs contacts the conductive landing pad, and wherein a vertical level of a lowermost surface of each of the plurality of conductive multifunction plugs is closer to the substrate than a vertical level of an uppermost surface of the conductive landing pad.

14. The integrated circuit device of claim 12, wherein each of the plurality of bit line structures comprises:

a bit line;

an insulating capping pattern covering an upper surface of the bit line; and an insulating spacer covering opposite sidewalls of the bit line and opposite sidewalls of the insulating capping pattern, and wherein each of the plurality of conductive multifunction plugs contacts at least one of an insulating capping pattern and an insulating spacer in a corresponding bit line structure of the plurality of bit line structures.

15. The integrated circuit device of claim 12, further comprising:

an upper electrode facing each of the plurality of lower electrodes and each of the plurality of conductive multifunction plugs, wherein the dielectric layer is disposed between the upper electrode and each of the plurality of lower electrodes and between the upper electrode and each of the plurality of conductive multifunction plugs, and wherein a vertical level of each interface of a plurality of interfaces between the plurality of conductive multifunction plugs and the plurality of lower electrodes is higher than a vertical level of a lowermost surface of the upper electrode.

16. The integrated circuit device of claim 12, wherein each of the plurality of conductive multifunction plugs is disposed in a space between a corresponding bit line structure among the plurality of bit line structures and a corresponding contact structure among the plurality of contact structures in the horizontal direction.

17. The integrated circuit device of claim 12, further comprising:

a guide insulation pattern having a lower surface covering the plurality of bit line structures and an upper surface contacting the dielectric layer, wherein the plurality of conductive multifunction plugs pass through the guide insulation pattern in the vertical direction, wherein each of the plurality of conductive multifunction plugs comprises:

an extended landing pad portion in contact with the guide insulation pattern; and an extended lower electrode portion covered by the dielectric layer, and wherein the extended landing pad portion and the extended lower electrode portion are integrally connected with each other.

18. The integrated circuit device of claim 12, wherein the plurality of conductive multifunction plugs and the plurality of lower electrodes include the same material.

19. The integrated circuit device of claim 12, wherein the plurality of conductive multifunction plugs and the plurality of lower electrodes include different materials.

20. An integrated circuit device comprising:

a substrate having an active region;

a bit line above the substrate;

an insulating structure covering an upper surface and a side-wall of the bit line;

a contact structure comprising:

a contact plug adjacent to the bit line in a horizontal direction and connected to the active region, wherein the insulating structure is disposed between the bit line and the contact plug, a metal silicide layer covering an upper surface of the contact plug, and a conductive landing pad covering an upper surface of the metal silicide layer;

a guide insulation pattern having:

a lower surface contacting the insulating structure and the conductive landing pad, and an upper surface at a vertical level farther from the substrate than an upper surface of the conductive landing pad;

a conductive multifunction plug comprising:

an extended landing pad portion contacting the insulating structure, the conductive landing pad, and the guide insulation pattern, and an extended lower electrode portion integrally connected to the extended landing pad portion and protruding beyond the upper surface of the guide insulation pattern in a first vertical direction away from the substrate; and a capacitor including:

a lower electrode contacting an upper surface of the conductive multifunction plug and extending along a straight line extending in the first vertical direction;

a dielectric layer covering a surface of the lower electrode and a portion of a sidewall of the extended lower electrode portion; and an upper electrode facing the lower electrode and the extended lower electrode portion, wherein the dielectric layer is disposed between the upper electrode and the lower electrode and between the upper electrode and the extended lower electrode portion.

* * * * *